(12) United States Patent
Schowalter et al.

(10) Patent No.: US 9,970,127 B2
(45) Date of Patent: *May 15, 2018

(54) METHOD AND APPARATUS FOR PRODUCING LARGE, SINGLE-CRYSTALS OF ALUMINUM NITRIDE

(71) Applicant: Crystal IS, Inc., Green Island, NY (US)

(72) Inventors: Leo Schowalter, Latham, NY (US); Glen A. Slack, Scotia, NY (US); Juan Carlos Rojo, South Beach, NY (US); Robert T. Bondokov, Watervliet, NY (US); Kenneth E. Morgan, Castleton, NY (US); Joseph A. Smart, Mooresville, NC (US)

(73) Assignee: CRYSTAL IS, INC., Green Island, NY (US)

( * ) Notice: Subject to any disclaimer, the term of this patent is extended or adjusted under 35 U.S.C. 154(b) by 39 days.

This patent is subject to a terminal disclaimer.

(21) Appl. No.: 15/231,141

(22) Filed: Aug. 8, 2016

(65) Prior Publication Data

US 2017/0159207 A1 Jun. 8, 2017

Related U.S. Application Data

(63) Continuation of application No. 14/520,615, filed on Oct. 22, 2014, now Pat. No. 9,447,521, which is a (Continued)

(51) Int. Cl.
*B32B 3/00* (2006.01)
*C30B 25/16* (2006.01)
(Continued)

(52) U.S. Cl.
CPC .......... *C30B 25/16* (2013.01); *C30B 11/003* (2013.01); *C30B 23/00* (2013.01); *C30B 23/025* (2013.01); *C30B 25/10* (2013.01); *C30B 25/14* (2013.01); *C30B 25/20* (2013.01); *C30B 29/403* (2013.01); *H01L 21/0254* (2013.01); *H01L 21/02389* (2013.01); *H01L 21/02458* (2013.01); *H01L 21/02634* (2013.01); *H01L 29/04* (2013.01); *H01L 29/0657* (2013.01); *H01L 29/2003* (2013.01); *H01L 29/205* (2013.01);
(Continued)

(58) Field of Classification Search
CPC ......... C30B 25/16; C30B 25/14; C30B 25/20; C30B 25/10; C30B 23/00; C30B 23/025; C30B 11/003; H01L 21/02389; H01L 21/02458; H01L 21/0254; H01L 21/02634; H01L 29/04; H01L 29/0657; H01L 29/2003; H01L 29/205; H01L 29/32
See application file for complete search history.

(56) References Cited

U.S. PATENT DOCUMENTS 8,545,629 B2 * 10/2013 Schowalter ........... C30B 11/003 117/952
8,896,020 B2 * 11/2014 Schowalter ........... C30B 11/003 257/103
9,447,521 B2 * 9/2016 Schowalter ........... C30B 11/003

* cited by examiner

*Primary Examiner* — Elizabeth E Mulvaney
(74) *Attorney, Agent, or Firm* — Morgan, Lewis & Bockius LLP

(57) ABSTRACT

Bulk single crystals of AlN having a diameter greater than about 25 mm and dislocation densities of about 10,000 cm$^{-2}$ or less and high-quality AlN substrates having surfaces of any desired crystallographic orientation fabricated from these bulk crystals.

21 Claims, 11 Drawing Sheets

Related U.S. Application Data continuation of application No. 13/974,710, filed on Aug. 23, 2013, now Pat. No. 8,896,020, which is a continuation of application No. 11/431,090, filed on May 9, 2006, now Pat. No. 8,545,629, which is a continuation-in-part of application No. 10/910,162, filed on Aug. 3, 2004, now abandoned, which is a continuation-in-part of application No. 10/324,998, filed on Dec. 20, 2002, now Pat. No. 6,770,135.

(60) Provisional application No. 60/344,672, filed on Dec. 24, 2001.

(51) Int. Cl.

| | | |
|---|---|---|
| H01L 29/32 | (2006.01) | |
| C30B 23/02 | (2006.01) | |
| C30B 11/00 | (2006.01) | |
| C30B 23/00 | (2006.01) | |
| C30B 29/40 | (2006.01) | |
| H01L 33/00 | (2010.01) | |
| H01L 29/04 | (2006.01) | |
| H01L 29/06 | (2006.01) | |
| H01L 29/20 | (2006.01) | |
| C30B 25/10 | (2006.01) | |
| C30B 25/14 | (2006.01) | |
| C30B 25/20 | (2006.01) | |
| H01L 21/02 | (2006.01) | |
| H01L 29/205 | (2006.01) | |
| H01L 29/66 | (2006.01) | |
| H01L 29/778 | (2006.01) | |
| H01L 33/12 | (2010.01) | |
| H01L 33/32 | (2010.01) | |
| H01L 33/02 | (2010.01) | |

(52) U.S. Cl.
CPC ........ *H01L 29/32* (2013.01); *H01L 29/66462* (2013.01); *H01L 29/7787* (2013.01); *H01L 33/0075* (2013.01); *H01L 33/12* (2013.01); *H01L 33/325* (2013.01); *H01L 33/025* (2013.01); *H01L 2924/0002* (2013.01); *Y10T 428/21* (2015.01)

US 9,970,127 B2

METHOD AND APPARATUS FOR PRODUCING LARGE, SINGLE-CRYSTALS OF ALUMINUM NITRIDE

RELATED APPLICATIONS

This application is a continuation of U.S. patent application Ser. No. 14/520,615, filed Oct. 22, 2014, which is a continuation of U.S. patent application Ser. No. 13/974,710, filed Aug. 23, 2013, which is a continuation of U.S. patent application Ser. No. 11/431,090, filed May 9, 2006, issued as U.S. Pat. No. 8,545,629 on Oct. 1, 2013, which is a continuation-in-part of co-pending U.S. patent application Ser. No. 10/910,162, filed Aug. 3, 2004, now abandoned, which is a continuation-in-part of U.S. patent application Ser. No. 10/324,998, filed Dec. 20, 2002, issued as U.S. Pat. No. 6,770,135 on Aug. 3, 2004, which claims the benefit of and priority to U.S. Provisional Application Ser. No. 60/344,672, filed Dec. 24, 2001. The entire disclosures of each of these applications are incorporated herein by reference.

GOVERNMENT SPONSORSHIP

The U.S. Government may have certain rights in this invention pursuant to SBIR Contract N00014-98-C-0053 awarded by the Office of Naval Research, under SBIR Contract F33615-00-C-5531 awarded by the Air Force Research Laboratory, under SBIR Contract F33615-00-C-5425 awarded by the Missile Defense Agency, and under ATP Contract 70NANB4H3051 awarded by the National Institute of Standards and Technology (NIST).

FIELD OF THE INVENTION

The present invention relates to the fabrication of single-crystal aluminum nitride (AlN) structures, and, more particularly, to growing relatively large, single-crystal AlN substrates by sublimation-recondensation technique at growth rates exceeding 0.3 mm/hr.

BACKGROUND OF THE INVENTION

Several types of materials are routinely used to fabricate substrates for nitride-based semiconductor structures, which, in turn, can be employed as components of high-performance electronic and optoelectronic devices.

For devices employing GaN or $Ga_{1-x}In_xN$, the most desirable substrate would nominally be a large-area GaN single-crystal wafer. While several methods to grow GaN crystals have been proposed, none of them appears to be commercially feasible to fabricate large-area bulk crystals of GaN.

Sapphire is a popular conventional substrate material, because relatively high-quality, inexpensive sapphire substrates are commercially available. However, sapphire is far from being perfectly suited for GaN epitaxy. Its lattice mismatch to GaN is relatively large (about 16%), it has little distinction between the + and − [0001] directions which can give rise to +/− c-axis domains in epitaxial films of GaN, and its differential thermal expansion may lead to cracking during the post-fabrication cooling process. In spite of those drawbacks, recently, Nichia Ltd of Japan has announced the production of a violet laser with significant commercial possibilities—more than 10,000 hours of operating life—using sapphire substrates. Currently, laser diodes ("LDs") are relatively expensive. Using sapphire substrates leads to a costly fabrication process because it requires growing buffer layers and using lateral epitaxial overgrowth techniques. Even though Nichia's announcement is very promising, violet lasers grown over sapphire substrates still have shortcomings. For example, heat may build up in these lasers during operation. Sapphire, with its very low thermal conductivity, traps that heat, which may trigger a premature burnout of these devices. To build a more durable blue laser, Nichia and others are investigating other alternatives, such as freestanding GaN substrates. In this technique, the substrate is removed after a thick GaN layer is grown thereover. This method leaves the GaN as the base for building the laser. This base should be better at dissipating heat, in addition to matching the alloy layers disposed thereover. However, this approach further increases process complexity and associated fabrication costs.

Single-crystal substrates of SiC present an attractive alternative to sapphire due to their close lattice match to AlN/GaN in the plane perpendicular to the c-axis (the so-called "c-plane") and high thermal conductivity. In addition, SiC substrates can be made electrically conducting, which is attractive for some applications, including fabrication of LEDs and LDs. However, wurtzite SiC (matching the wurtzite crystal structure of GaN) is not available and the lattice mismatch along the c-axis between GaN and both 4H and 6H SiC is substantial. In addition, the chemical bonding between the Group IV elements of the SiC and the Group III or Group V elements of the nitrides is likely to create nucleation problems leading to electronic states at the interface.

It is, therefore, desirable to provide alternative substrates for commercial fabrication of nitride-based (e.g., GaN) devices. In particular, the physical and electronic properties of AlN—wide energy bandgap (6.2 electron volts), high breakdown electric field, extremely high thermal conductivity, and low optical density—afford this material a great potential for a wide variety of semiconductor applications as a substrate material. Despite these useful properties of AlN substrates, commercial feasibility of AlN-based semiconductor devices, however, have been limited by the unavailability of large, low-defect single crystals of AlN.

A sublimation-recondensation technique was developed for AlN crystal growth by Slack and McNelly (G. A. Slack and T. McNelly, J. Cryst. Growth 34, 263 (1976) and 42, 560 (1977), hereinafter the "Slack reference," incorporated herein by reference). In this technique, polycrystalline source material is placed in the hot end of a crucible while the other end is kept cooler. The crystal nucleates in the tip and grows as the crucible is moved through the temperature gradient. This approach demonstrated relatively slow crystal growth of 0.3 mm/hr while the crystal growth chamber was maintained at 1 atm of $N_2$, producing a conical crystal about 12 mm in length and about 4 mm in diameter.

To make AlN substrates and devices built thereon commercially feasible, it would be desirable to increase the growth rate. A number of researchers have examined the possibility of such increase. Many of them, however, relied on rate equations derived by Dryburgh (see "Estimation of maximum growth rate for aluminum nitride crystals by direct sublimation," J. Crystal Growth 125, 65 (1992)), which appear to overestimate the growth rate of AlN and, in particular, suggest that the maximum growth conditions are near stoichiometric vapor conditions, i.e., the Al and $N_2$ partial pressures should be adjusted so that the Al partial pressure is twice that of the $N_2$. See, for example, U.S. Pat. Nos. 5,858,085; 5,972,109; 6,045,612; 6,048,813; 6,063,185; 6,086,672; and 6,296,956, all to Hunter. In addition, known approaches generally maintain the $N_2$ partial pressure at less than atmospheric pressure.

Most attempts at increasing the growth rate of AlN crystals under such stoichiometric and/or sub-atmospheric pressure conditions have met with limited success. In addition, it appears to be impossible to achieve the growth rate, or the electronics-grade quality Hunter discloses in his patents with the $N_2$ pressure below one atmosphere. Additional research in the field of fabrication of AlN crystals was reported by Segal and his colleagues. (See Segal et al. "On mechanisms of sublimation growth of AlN bulk crystals," J. Crystal Growth 211, 68 (2000)). This article appears to be the first peer-reviewed publication suggesting that Dryburgh's growth equations are incorrect. Segal and his colleagues, however, teach open growth conditions, allowing the Al vapor to escape. Disadvantageously, it would be difficult to grow large boules of AlN using this approach, because: (i) due to the non-uniform growth across the surface, growth control is difficult; (ii) a large amount of Al would be wasted; (iii) the excess Al in the rest of the furnace would create problems due to of its high reactivity; and (iv) it would be difficult to maintain a high temperature differential between the source and growing crystal surface.

Critical to the ability to made commercially practical nitride-based semiconductor devices, is achieving low levels of defect densities throughout the semiconductor structure. With conventional nitride semiconductor growth techniques on commonly available foreign substrates or high-defect nitride substrates, a GaN buffer layer is grown thick to achieve planar growth fronts and to relax the GaN epitaxial layers prior to formation of the active region of the device, i.e. the GaN/AlGaN heterostructure. This approach will result in epitaxial layers with defect densities in the $10^8$ cm$^{-2}$ to $10^{10}$ cm$^{-2}$ range.

Other researchers have attempted to reduce dislocation densities by epitaxial lateral overgrowth, novel nucleation schemes to initiate growth on the foreign substrates, or by adding complex structure such as superlattices into the epitaxial profile. For example, Sumitomo Electric has reported local regions of $10^5$ dislocations per cm$^2$ although the average dislocation density in their GaN substrates exceeds $10^6$ cm$^{-2}$. Also, researchers from Tokyo University of Agriculture and Technology and TDI reported the defect densities of $10^2$ cm$^{-2}$. Work by others on AlN templates can be expected to have a large defect density due to the initial growth on a foreign substrate, even though the original substrate might be removed to obtain a freestanding AlN wafer.

Thus, present state-of-the-art technology employs foreign substrates that have large thermal and lattice differences relative to AlN, AlGaN, and GaN epitaxial layers. This results in defect densities ranging from $10^8$ cm$^{-2}$ to $10^{10}$ cm$^{-2}$, which makes certain devices—especially devices employing AlGaN layers with high Al content—unrealizable.

A need therefore exists for large AlN substrates suitable for fabricating semiconductor devices thereon and commercially-feasible methods for manufacturing these substrates that address the aforementioned drawbacks.

SUMMARY OF THE INVENTION

Accordingly, in its various aspects and embodiments, the present invention focuses on methods and apparatus for producing AlN substrates that advantageously have a relatively small lattice mismatch (around 2.2%) with respect to GaN, and which have an almost identical thermal expansion from room temperature to 1000° C.

Furthermore, bulk AlN crystals grown using various embodiments of the claimed fabrication methods may have a radial dimension exceeding 10-15 mm and a length exceeding 5 mm. Also, the claimed invention facilitates fabrication of AlN crystals having very low dislocation densities—under 10,000 cm$^{-2}$, typically, about 1,000 cm$^{-2}$ or less, and, in some embodiments, being substantially devoid of dislocation defects. These bulk crystals, in turn, enable the fabrication of high-quality AlN substrates having surfaces of any desired crystallographic orientation by slicing them out of properly oriented bulk crystals. Possible orientations include the c-face which is cut parallel to the (0001) plane, the a-face which is cut parallel to the (1120) plane, and the m-face which is cut parallel to the (1010) plane.

These AlN crystals also advantageously have the same wurtzite crystal structure as GaN and nominally the same piezoelectric polarity. Also, the chemical compatibility with GaN is much better than that of SiC. In addition, AlN substrates cut from the bulk crystals tend to be attractive for $Al_xGa_{1-x}N$ devices requiring higher Al concentration (e.g., for high-temperature, high-power, radiation-hardened, and ultraviolet wavelength applications). Emerging optoelectronic and electronic devices based on the epitaxial growth of GaN and $Al_xGa_{1-x}N$ layers may significantly benefit from such an improved substrate.

Generally, in one aspect, the invention features an apparatus for growing a bulk single-crystal aluminum nitride. The apparatus includes a housing defining a growth chamber, the housing including a gas outlet configured for selectively evacuating and venting the growth chamber, a gas inlet configured for pressurizing the growth chamber, and a viewing port configured for pyrometric monitoring of crystal growth temperatures within the growth chamber. A radio frequency ("RF") coil is disposed within the growth chamber and configured for inducing an electromagnetic field therein. A quartz tube is disposed coaxially within the coil. A first set of shielding is disposed coaxially within the quartz tube, including from about 5 to about 7 concentric pyrolytic boron nitride (pBN) cylinders, each of the pBN cylinders having a wall thickness of greater than about 0.05 inches (0.13 cm), each of the cylinders having a length dimension along the longitudinal axis greater than the length dimension of the coil. A second set of shielding is disposed coaxially within the first set of shielding, the second set of shielding including two concentric, open joint tungsten cylinders, each of the tungsten cylinders having a wall thickness of less than about 0.005 inches (0.013 cm); each of the tungsten cylinders having a length dimension along the longitudinal axis less than the length dimension of the RF coil. A push tube is disposed coaxially within the second set of shielding; the push tube having a proximal side and a distal side, the distal side including a set of metallic baffles having a center hole which provides for the pyrometric monitoring of crystal growth temperatures, the proximal side including another set of metallic baffles. A crucible is disposed coaxially within the push tube, the crucible having a conically shaped distal end and a proximal end; the crucible defining a crystal growth enclosure; the proximal end including a high purity, polycrystalline aluminum nitride source material, the distal end being configured for growth of the bulk single crystal aluminum nitride. The push tube is disposed on a push rod assembly configured for sliding the crucible and the push tube along the longitudinal axis. The first set of shielding and the second set of shielding are configured to provide a thermal gradient axially within the cavity of the crucible of greater than about 100° C./cm.

In another aspect, the invention is directed to a method for growing bulk single crystals of aluminum nitride. The method includes utilizing the apparatus described above, purging the growth chamber by evacuating the growth chamber to a pressure less than or equal to about 0.01 mbar (1 Pa), and refilling the growth chamber with substantially pure nitrogen gas to a pressure of about 1 bar (100 kPa). The growth chamber is then evacuated to a pressure less than or equal to about 0.01 mbar (1 Pa), and then pressurized to about 1 bar (100 kPa) with a gas including about 95% nitrogen and about 5% hydrogen. The chamber is heated to a first temperature, the heating including ramping the temperature of the conical upper end of the crucible to about 1800° C. in a period of about 15 minutes. The growth chamber is then pressurized to about 1.3 bar (130 kPa) with the gas including about 95% nitrogen and about 5% hydrogen, and heated to a growth temperature. A distal end of the crucible is then ramped to about 2200° C. in a period of about 5 hours. The push tube and the crucible are moved axially through the growth chamber at a rate of about 0.4 to about 0.9 millimeters per hour, wherein single crystals of aluminum nitride are grown.

In yet another aspect, the invention focuses on a method for growing bulk single crystals of aluminum nitride. The method includes evacuating a growth chamber, pressurizing the growth chamber to about 1 bar with a gas including about 95% nitrogen and about 5% hydrogen, and placing source polycrystalline AlN in a proximal end of a crystal growth enclosure. The method further includes placing a distal end of the crystal growth enclosure in a high temperature region of the growth chamber, ramping the high temperature region to about 1800° C., maintaining pressure in the growth chamber at about 1.3 bar, and ramping the high temperature region to about 2200° C. The distal end of the crystal growth enclosure is moved towards a low temperature region of growth chamber at a rate of about 0.4 to about 0.9 millimeters per hour, wherein a single crystal of aluminum nitride grows at the distal end of the crystal growth enclosure.

A further aspect of the invention involves a method of producing bulk single crystals of AlN, which includes providing in a crystal growth enclosure Al and $N_2$ vapor capable of forming bulk crystals, maintaining in the crystal growth enclosure a $N_2$ partial pressure which is greater than the stoichiometric pressure relative to the Al, maintaining the total vapor pressure in the crystal growth enclosure at super-atmospheric pressure, and providing at least one nucleation site in the crystal growth enclosure. The method also includes cooling the nucleation site relative to other locations in the crystal growth enclosure, and depositing the vapor under conditions capable of growing single crystalline AlN originating at the nucleation site. A variation of this aspect includes producing a prepared substrate by cutting a wafer or a cylinder from the bulk single crystal; preparing a surface on the wafer or cylinder receptive to an epitaxial layer; and depositing an epitaxial layer or a complete crystal boule on the surface.

In yet another aspect, the invention features a system for producing bulk single crystals of AlN. The system includes a source of Al and $N_2$ vapor, a crystal growth enclosure for containing the vapor, and at least one nucleation site in the crystal growth enclosure. The crystal growth enclosure has a selective barrier configured to permit migration of $N_2$ therethrough, and to substantially prevent migration of Al therethrough. A pressurization system is configured to maintain, in the crystal growth enclosure, a $N_2$ partial pressure greater than stoichiometric pressure relative to the Al, and to maintain the total vapor pressure in the crystal growth enclosure at super-atmospheric pressure. A selective heating system is configured to maintain the nucleation site at a temperature lower than at other locations in the crystal growth enclosure.

In yet another aspect, the invention features a single-crystal AlN boule having a diameter greater than about 25 mm and a dislocation density less than about 10,000 $cm^{-2}$. In various embodiments, the thickness of the boule is greater than about 15 mm. In some embodiments, the AlN boule has a dislocation density of about 10,000 $cm^{-2}$ or less, for example, 5,000 $cm^{-2}$ or less, or, more particularly, about 1,000 $cm^{-2}$ or less. In certain embodiments, the dislocation density is about 500 $cm^{-2}$, or as low as 100 $cm^{-2}$. In a particular embodiment, the boule has at least one region substantially devoid of dislocation defects.

Also, in still another aspect, the invention involves a method for fabricating a semiconductor device, such as a solid-state laser diode or a solid state LED. The method includes forming a bulk single crystal of aluminum nitride using any of the methods described above, followed by removing the bulk single crystal of aluminum nitride from the crystal growth enclosure and cutting it to form a substrate of AlN. The substrate may have a diameter greater than about 25 mm, a thickness of less than about 1 mm—for example, about 500 µm or about 350 µm—and a dislocation density less than about 10,000 $cm^{-2}$. The method further includes depositing, on the AlN substrate, at least two layers independently selected from the group consisting of AlN, GaN, InN, and binary or tertiary alloy combinations thereof.

In two further aspects, the present invention features solid-state UV LD and UV LED devices, including at least two layers, each of which is independently selected from AlN, GaN, InN, or binary or tertiary alloy combinations thereof. These devices are disposed atop a substrate of AlN having a dislocation density of about 10,000 $cm^{-2}$ or less, for example, 5,000 $cm^{-2}$ or less, or, more particularly, about 1,000 $cm^{-2}$ or less. In certain embodiments, the dislocation density is about 500 $cm^{-2}$, or as low as 100 $cm^{-2}$. Indeed, as mentioned above, the invention facilitates production of AlN substantially devoid of dislocation defects. In a particular embodiment, the substrate has at least one region substantially devoid of dislocation defects.

In yet another aspect, the invention is directed to a semiconductor structure including an aluminum nitride single-crystal substrate having a diameter greater than about 25 mm; and at least one strained layer epitaxially grown thereover, the strained layer including, or consisting essentially of, a material selected from the group consisting of AlN, GaN, InN, and any binary or tertiary alloy combination thereof, wherein an average dislocation density within the semiconductor heterostructure is less than about 10,000 $cm^{-2}$. The semiconductor structure may also include at least one buffer layer, for example, including or consisting essentially of, aluminum nitride, disposed between the substrate and the strained layer.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DESCRIPTION OF INVENTION

Figure 1:
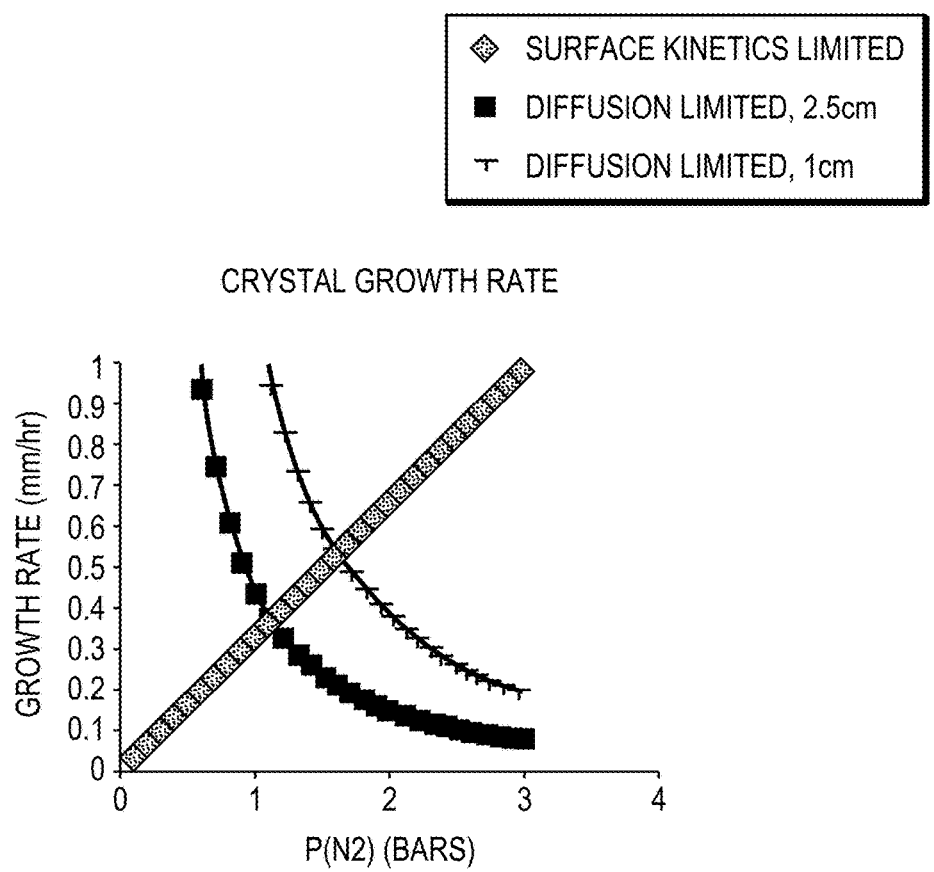
FIG. 1 is a graphical representation of crystal growth rate as a function of nitrogen pressure, determined in accordance with various aspects of the present invention.

As mentioned above, the present invention focuses on methods and apparatus for producing AlN substrates that advantageously have a relatively small lattice mismatch (around 2.2%) with respect to GaN, and have an almost identical thermal expansion from room temperature to 1000° C. Furthermore, AlN crystals grown in accordance with the techniques disclosed herein have a low dislocation density of 10,000 $cm^{-2}$ or less and may be grown to exceed 20-30 mm in diameter and 5 mm in length. These AlN crystals also advantageously have the same wurtzite crystal structure as GaN and nominally the same piezoelectric polarity. Also, the chemical compatibility with GaN is much better than that of the SiC. In addition, AlN substrates cut from the bulk crystals tend to be attractive for $Al_xGa_{1-x}N$ devices requiring higher Al concentration (e.g., for high temperature, high power, radiation-hardened, and UV wavelength applications).

Various aspects of the present invention stem from the recognition that, contrary to the teachings of the prior art, super-atmospheric pressures may be successfully utilized to produce single crystals of AlN at relatively high growth rates and crystal quality. The invention generally contemplates controlling one or more of (i) temperature difference between an AlN source material and growing crystal surface, (ii) distance between the source material and the growing crystal surface, and (iii) ratio of $N_2$ to Al partial vapor pressures. The invention further contemplates increasing the $N_2$ pressure beyond the stoichiometric pressure to force the crystal to grow at a relatively high rate due to the increased reaction rate at the interface between the growing crystal and the vapor. This increase in the growth rate has been shown to continue with increasing $N_2$ partial pressure until diffusion of Al from the source to the growing crystal (i.e., the negative effects of requiring the Al species to diffuse through the $N_2$ gas) becomes the rate-limiting step. Various aspects of the present invention also contemplate a technique for establishing $N_2$ pressures suitable for crystal growth, as will be discussed in greater detail hereinbelow. Moreover, employing higher-pressure nitrogen may have the added benefit of reducing the partial pressure of aluminum inside the growth crucible, which may decrease corrosion within the furnace often caused by Al vapor inadvertently escaping the crucible.

In its various aspects, the present invention also features an apparatus, including a crystal growth enclosure or "crucible," capable of providing a relatively sharp thermal profile, i.e., a relatively large thermal gradient along a relatively short axial distance, for sublimation and recondensation/nucleation. The crucible is configured to operate at internal super-atmospheric pressures. During operation, the crystal nucleates at a nucleation site, for example at the tip of the crucible, and grows at a relatively high rate as the crucible moves relative to the temperature gradient. As used herein, the term "axial" refers to a direction relative to the apparatus of the present invention, which is substantially parallel to push rod 17 shown in FIG. 2. Also, the term "nucleation site" refers to a location of either seeded or unseeded crystal growth.

Before describing the apparatus and method of its operation in detail, a description of the development and theory of the invention is in order. As early as 1998, the inventors developed a model of $N_2$ and Al incorporation into a growing AlN crystal. Particular aspects of this model are discussed in greater detail hereinbelow. It was found that the $N_2$ molecule is relatively difficult to incorporate into a growing crystal, which leads to a small condensation coefficient for this molecule. For this reason, the rate at which $N_2$ molecules collide with the AlN surface (i.e., the $N_2$ flux) when the crystal is in equilibrium with a mixed vapor of Al and $N_2$ is much greater than the rate at which $N_2$ evaporates from the surface when the crystal is heated to the same temperature in a vacuum (the so-called Langmuir evaporation rate). Using only the equilibrium pressures and the measured Langmuir evaporation rate, the model was able to correctly predict the maximum rate that AlN crystals could be grown in atmospheric pressure $N_2$. More importantly, the model showed that the crystal growth rate, in sublimation-recondensation growth if limited only by the surface kinetics of $N_2$ incorporation, is directly proportional to the $N_2$ pressure up to high pressures, which may be as high as 200 bar (20 MPa). This result is quite different from most crystal growth systems where the kinetically limited growth rate at the surface is maximized when the gas mixture above the growing crystal surface has the same stoichiometry as the growing crystal. It was also found that the Langmuir evaporation rate is almost 1000 times faster than the predicted AlN crystal growth rate at atmospheric pressure (even when diffusion is neglected). It is generally anticipated that one should be able to achieve growth rates comparable to the Langmuir evaporation by going to stoichiometric gas mixtures. However, the AlN crystal growth system is very different because of the difficulty in breaking the $N_2$ molecules into N atoms which are then incorporated into the growing crystal.

While not wishing to be bound by a particular theory, the above result can be understood in view of the teachings of the present invention by recognizing that the recondensation rate on the growing seed crystal generally matches the evaporation rate from the polycrystalline AlN starting material during steady-state crystal growth. The AlN starting material will sublime stoichiometrically and produce Al and $N_2$ vapor (the concentration of other gas species is believed to be too low to impact the growth rate). Thus, by controlling the nitrogen pressure externally, the Al partial pressure may rise until a steady state is achieved between evaporation at the hot surface and recondensation at the cold surface. Because of the low condensation coefficient for $N_2$, it has been found that the rate of evaporation/recondensation, as a function of temperature, is greater at nitrogen pressures that exceed the average stoichiometric pressure for AlN when the source material is AlN ceramic.

Figure 2:
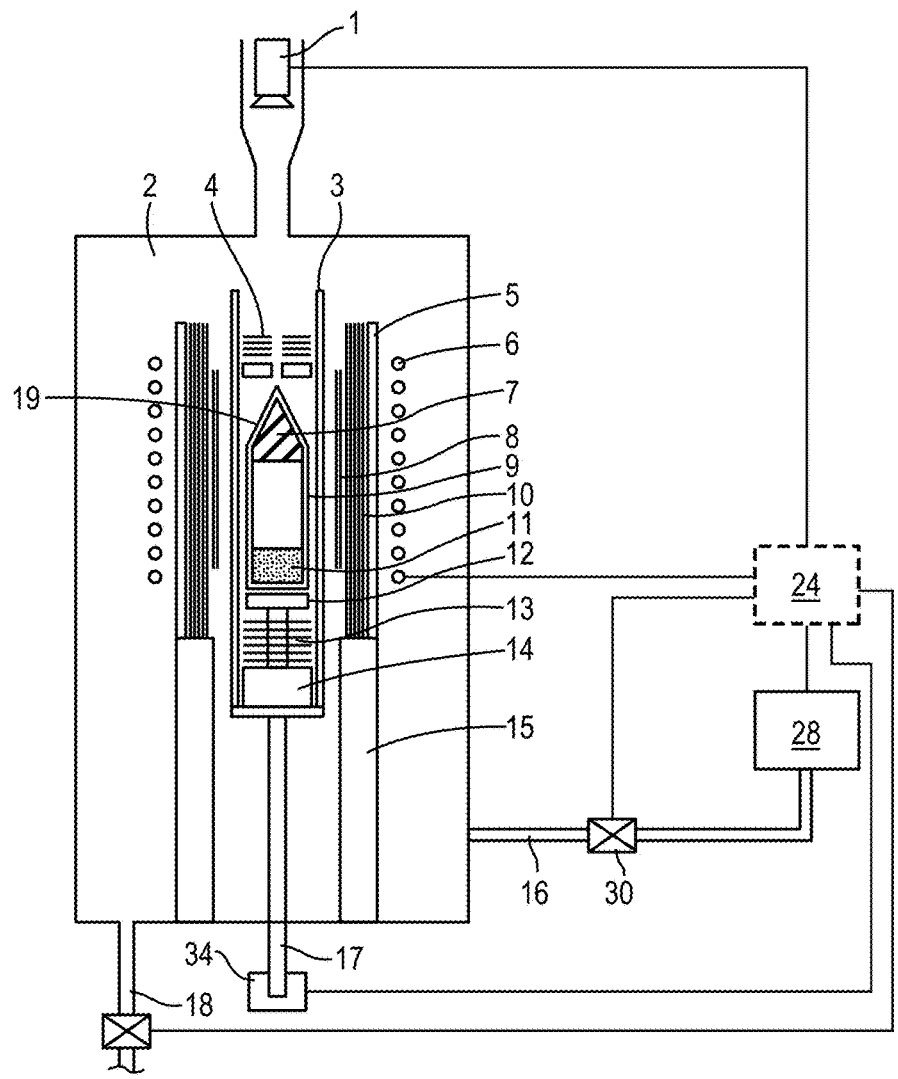
FIG. 2 is a schematic elevational view of one embodiment of an apparatus of the present invention.

Referring to FIG. 2, at relatively low $N_2$ pressures, for realistic temperature differences between the polycrystalline starting material 11 and the seed 7, this effect leads to relatively slow growth rates. This is a very different situation from crystal growth by sublimation/recondensation when both species have near unity accommodation coefficients such as the case in SiC. Unfortunately, when the $N_2$ pressure exceeds the stoichiometric partial pressure for a given partial pressure of Al when stoichiometric, $P_{N2}=0.5 \times P_{Al}$, mass transport of the Al, relative to the nitrogen gas, to the growing crystal surface is generally needed. Thus, at some point, the growth rate becomes limited by diffusion of Al atoms through the gas phase even though the surface kinetics would continue to predict increased crystal growth rate with increasing $N_2$ pressure. Based on the inventors' present understanding of the surface kinetics involved, it has been found that this cross-over point is only slightly greater than 1 atmosphere for the growth geometry that was used by Slack and co-workers in the aforementioned Slack reference, and as shown in FIG. 1. However, during development of the present invention, it was found that this cross-over point is also dependent upon the diffusion lengths required for Al transport (which was approximately 2 to 5 cm in prior research). By reducing this axial length in various embodiments of the present invention, which have been specifically configured to create a very sharp thermal profile in the work zone, it is has been found possible to significantly increase the growth rate relative to prior approaches.

Turning now back to FIG. 1, the predicted AlN growth rate is shown as a function of $N_2$ pressure. The curves labeled with squares and crosses show the growth rates assuming that it is limited by the diffusion of Al (for a 2.5 cm or 1 cm diffusion length, respectively) with no convection, while the third curve shows the predicted growth rate assuming that the growth rate is limited by the surface kinetics of nitrogen incorporation (ignoring gas-phase diffusion). The model assumes that the AlN source material is at 2300° C. while the growing crystal is maintained at 2200° C. These calculations also assume that the area of the evaporating surface and that of the growing crystal are equal and that diffusion effects may be neglected. This last assumption, as shown, ceases to be true at high enough $N_2$ pressure. The cross-over point generally depends on the experimental geometry.

Referring again to FIG. 2, many embodiments of the present invention have demonstrated that the diffusion issues described above can be addressed, at least in part, by providing a net flow of gas from the source 11 towards the growing crystal 7 greater than that caused simply by the evaporation and recondensation process. This may be obtained when a thin-wall tungsten crucible 9 is used, and it may also be possible to obtain this effect with other crucible materials that are pervious to nitrogen gas, or with other types of selective barriers such as openings 20, 21, described hereinbelow with respect to FIGS. 3-5. Nitrogen is able to diffuse through thin-walled tungsten crucibles at fairly high rates at the crystal growth temperatures (2300° C.) employed herein. The diffusion rate of Al through the tungsten walls is much lower. Thus, under equilibrium conditions, the partial pressure of nitrogen inside the crucible is identical to that outside the crucible, e.g., in chamber 2 in FIG. 2, while the total pressure of gasses inside the crucible may be higher due to the partial pressure of the Al vapor.

However, once crystal growth is initiated and the AlN source is maintained at a higher temperature than the growing crystal, the nitrogen partial pressure at the cool end (e.g., location 19 of the growing crystal 7) of the crucible tends to become greater than at the hot end, while the opposite is true for the aluminum pressure. Meanwhile, the total gas pressure inside the crucible remains substantially uniform throughout to maintain mechanical equilibrium. (As used herein, the term "mechanical equilibrium" refers to instances in which the total vapor pressures interior and exterior to the crystal growth chamber are substantially equal.) Thus, the nitrogen partial pressure at the cold end 19 of the crucible tends to exceed the nitrogen pressure outside the crucible (within chamber 2) while the opposite is true at the hot end. For this reason, nitrogen tends to diffuse out of the crucible at the cold end and diffuse into the crucible at the hot end, resulting in a net flow of the gas mixture in the crucible from the AlN source toward the growing crystal.

While the understanding of this operation is new, its effect is consistent with the experimental results achieved by Slack and McNelly and discussed in the Slack reference since their observed crystal growth rate of 0.3 mm/hr nominally could not have been achieved otherwise. In addition, Slack and McNelly observed that when pinholes were formed in the CVD tungsten crucibles they used, the AlN vapor would escape. It has been discovered by the present applicants that this occurs because, as explained above, the total gas pressure in the crucible is greater than the nitrogen pressure outside the crucible. Once a pinhole opens up, the gas mixture in the crucible containing Al and $N_2$ starts being pushed out of the crucible. However, in this instance, nitrogen gas continues to diffuse from the outside through the walls of the crucible because the partial pressure of $N_2$ is lower in the crucible than it was outside. Thus, the pressure in the crucible may be kept higher than the outside even when a pinhole is continuing to vent the gas mixture from the crucible. The process typically continues until substantially the entire Al vapor inside the crucible is exhausted. Another source of additional gas flow may be generated by the selective absorption of Al by the crucible walls.

Figure 3:
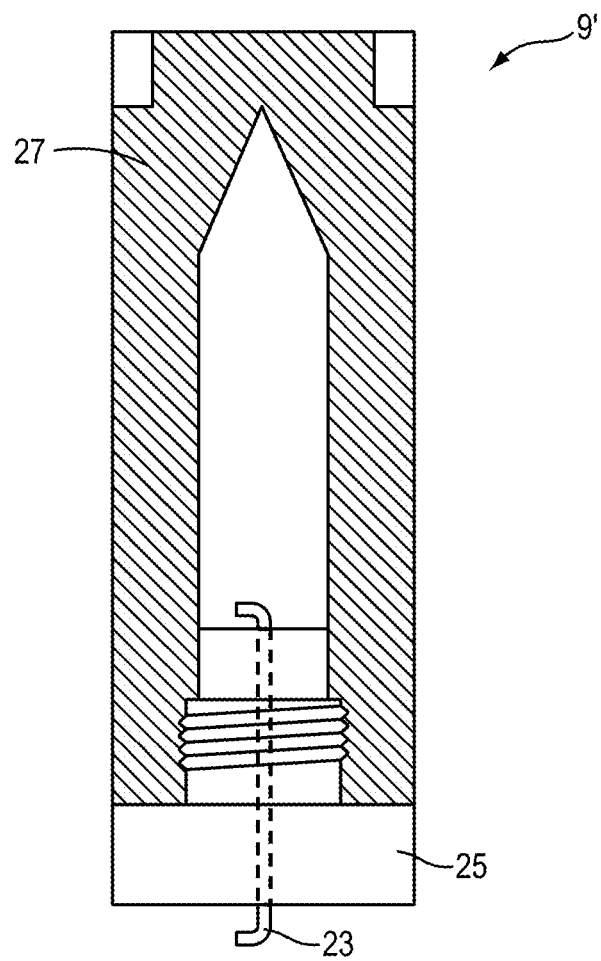
FIG. 3 is a schematic elevational view of an alternative embodiment of a component suitable for use with the apparatus of FIG. 2.
Figure 4:
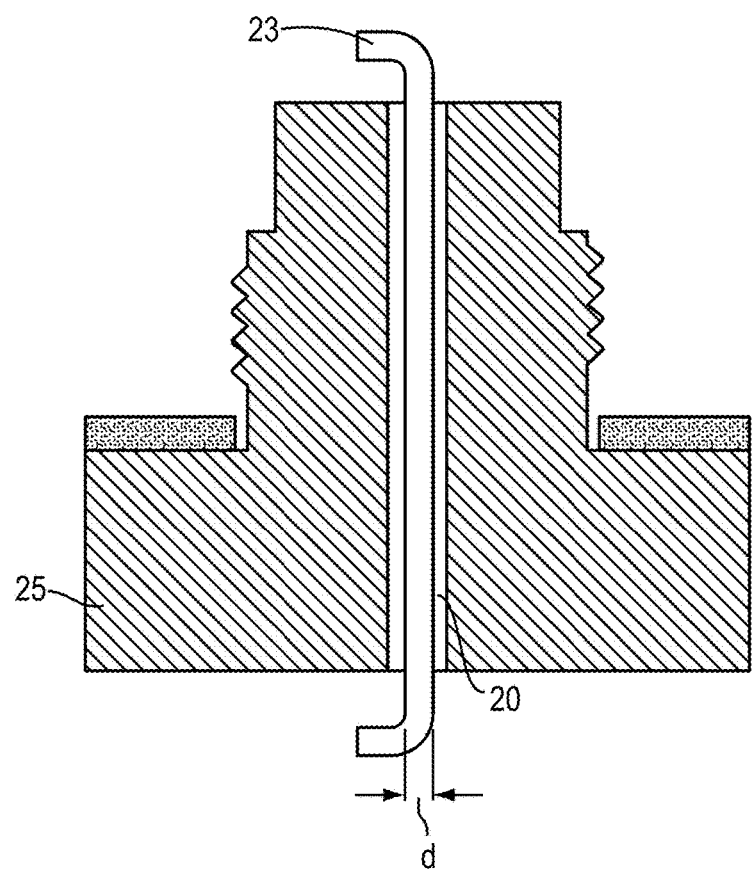
FIG. 4 is a schematic elevational view, on an enlarged scale, of the component of FIG. 3.

Thus, in particular embodiments of the present invention, a crucible may be provided with one or more openings to facilitate nitrogen pressure control/equilibration of the crucible, as will be discussed in greater detail hereinbelow with respect to FIGS. 3-5.

Growth Rate Model

As mentioned hereinabove, various aspects of the present invention stem from inventors' analysis of the applicable surface kinetics. The rate at which Al and N incorporate into the growing AlN has generally been modeled in two approaches. In the first, it is assumed that the nitrogen molecules $N_2$ have a relatively low condensation coefficient compared to the Al atoms due to a configurational barrier. In the second approach, it is assumed that the $N_2$ molecules physisorb onto the AlN surface. These $N_2$ molecules are then assumed to be kinetically hindered in the production of N atoms that can then incorporate into the AlN crystal. The inventors herein have modeled both approaches and both models lead to identical results.

The rate of change of the surface concentration [Al] of aluminum may be given by:

$$\frac{d[Al]}{dt} = \beta_{Al}P_{Al} - C_{Al}[Al] - B\left([Al] - \frac{K_s}{[N]}\right). \qquad (1)$$

Likewise, the rate of change of the surface concentration [N] of nitrogen atoms is:

$$\frac{d[N]}{dt} = 2\gamma\beta_{N2}P_{N2} - C_N[N]^2 - B\left([Al] - \frac{K_s}{[N]}\right). \qquad (2)$$

In these equations, the first term represents the addition of molecules from the vapor. It is assumed that all of the Al atoms stick but only a fraction y of the $N_2$ molecules condense on the surface. The term $B_i$ represents the modified Hertz-Knudsen factor which is proportional to the square root of mass of the $i^{th}$ species (where i represents either Al or $N_2$) divided by the temperature. The condensation coefficient in this model is not subscripted since we assume that it only applies to the $N_2$ molecules.

In the equations above, the second term represents the evaporation of molecules into the vapor. The $C_i$ term is a parameter introduced to describe the rate of evaporation of the $i^{th}$ species. Note that the evaporation of $N_2$ molecules proceeds like the square of the [N] concentration on the surface. Finally the last term represents the incorporation (or dissolution) of Al and N atoms into the crystal where B is another parameter that is introduced. It is assumed that [Al] and [N] maintain an equilibrium concentration on the surface so as to obey $$[Al] \times [N] = K_S \qquad (3)$$

where $K_S$ is the equilibrium constant. It is also assumed that the N and Al atoms on the surface come into equilibrium very rapidly, which can be modeled by making the assumption that B is very large. This tends to constrain the [Al] and [N] concentrations to obey equation (3) almost exactly. The deviation from equilibrium tends to be just large enough so that the time derivatives of [Al] and [N] are equal to zero once steady state is achieved. The actual value of B is typically irrelevant under these circumstances.

These rate equations lead to a relatively simple cubic equation describing the net flux $F_{AlN}$ onto/off the surface of the AlN crystal, $$\left(\frac{E_L^3 P_{N2}}{4\beta_{Al}^2 P_S^3} - F_{AlN}\right) \cdot (\beta_{Al}P_{Al} - F_{AlN})^2 = E_L^3. \qquad (4)$$

Significantly, the only parameters appearing in this cubic equation are the Langmuir evaporation rate $E_L$ and the stoichiometric nitrogen pressure $P_S$. It is rather remarkable that, in the limit of very large B, of the five free parameters that appear in Eqs. (1) and (2), only two parameters are needed in Eq. (4) to determine the net flux at any nitrogen and aluminum partial pressure. Both of these parameters have been determined experimentally although there is substantial uncertainty in the Langmuir-evaporation rate as pointed out earlier.

These equations thus support the use of increasing nitrogen pressure beyond stoichiometric pressures, which is contrary to prior teachings as discussed hereinabove. In the limit of a small value of y, on the order of $10^{-5}$, it is possible to linearize this expression to give $F_{AlN}$ as a linear function of $P_{N2}$. The growth rate can be determined by setting $$F_{AlN}(T_H) = -F_{AlN}(T_C). \qquad (5)$$

A simple expression for this growth rate that depends on the difference in temperature $\Delta_T = T_H - T_C$ and on the nitrogen pressure, which may be controlled independently, has been determined. If the effects of diffusion are ignored (so that the partial pressures of $N_2$ and Al are constant in the region between the source and seed), for a given $\Delta_T$ and $N_2$ pressure, the Al pressure tends to adjust itself to some value intermediary to the equilibrium Al pressures at the hot and cold surfaces so as to force Eq. (5) to be true. In this case, $$F_{AlN} = A_o(\Delta T, T_H) P_{N2}. \qquad (6)$$

The value of $F_{AlN}$ is linear in $\Delta_T$ for $\Delta_T < 100°$ C. It has been found that the linear dependence of $F_{AlN}$ on $P_{N2}$ is valid (within 1%) between 0 and 200 bars of nitrogen gas for the experimentally determined values of $E_L$ and P, in the temperature range 2000° C.$<T_H<$2500° C. It has been determined that $$A_o(\Delta T = 50° \text{ C.}, T_H = 2300° \text{ C.}) = 0.156 \text{ mm-hr}^{-1}\text{-bar}^{-1} \qquad (7)$$

using the data of Bolgar et al. (A. S. Bolgar, S. P. Gordienko, E. A. Ryklis, and V. V. Fesenko, in "Khim. Fiz. Nitridov", p. 151-6 (1968) [Chem. Abstr. 71, 34003] (1969)]) for the Langmuir evaporation rate (259 mm/hr) and the equilibrium, stoichiometric nitrogen pressure determined from the JANAF tables (M. W. Chase et al. "JANAF Thermochemical Tables", Third Edition (1985), see J. Phys. Chem. Ref. Data 14, Supplement No. 1 (1985)), $P_S$(2300° C.)=0.13 bar. This equilibrium pressure would lead to an effective growth rate of 18.9 m/hr if all the nitrogen and aluminum stuck to the surface without re-evaporation and $P_{Al} = 2P_{N2} = P_s$, such as shown in FIG. 1. These calculations assume that the area of the evaporating surface and that of the growing crystal are equal and that diffusion effects may be neglected. This last assumption is rather important and, as FIG. 1 shows, ceases to be true at high enough $N_2$ pressure.

The observed growth rate in the Slack reference for $T_H$=2300° C. and $T_C$=2200° C. run in 0.95 bar of $N_2$ plus 0.05 bar of $H_2$ was 0.30 mm/hr. This should be compared with the theoretically determined growth rate of 0.32 mm/hr. This is a remarkable agreement given the uncertainties in the experimental data for the Langmuir evaporation rate and in the measured growth rate by Slack and McNelly. There are no adjustable parameters in the way that this theory was developed, the theory only depends on the experimentally-determined equilibrium pressures and the measured Langmuir evaporation rates. Notably, the experiment was conducted in a crucible where the growing crystal surface was smaller than the evaporating AlN source material. This tends to lead to an amplification of the observed growth rate. It should also be noted that these equations predict a theoretical growth rate of 0.020 mm/hr at the stoichiometric nitrogen pressure (0.13 bar) at a source temperature of 2300° C. and a $\Delta_T$ of 50° C.

Crystal Growth Furnace

Turning now to FIG. 2, the apparatus of the present invention, for example, a furnace, includes a heating source 6, such as a radio-frequency ("RF") coil for inducing an electro-magnetic field within a growth chamber 2. This electro-magnetic field couples with a metallic susceptor, for example a push tube 3 located concentrically inside the coil and provokes heat generation thereon by the Joule effect. Although in a particular embodiment, susceptor/tube 3 is cylindrical, i.e., has a circular axial cross-section, as used herein, the terms "tube" or "tubular" also include tubes of non-circular axial cross-section. The relative position and dimension of the push tube with respect to the shielding elements and coil creates a thermal gradient along the walls of the susceptor 3, i.e., in the axial direction. A crucible 9 is movably disposed concentrically within tube 3, and includes the high-purity source material 11 at a proximal end thereof, e.g. polycrystalline AlN, and eventually, the growing AlN crystal 7 at the distal end (e.g., at tip 19) thereof.

The crucible 9 may be fabricated from material such as tungsten or rhenium or tantalum nitride, having walls such as discussed hereinabove, which are thin enough to form a barrier which selectively permits and prevents the respective diffusion of nitrogen and aluminum, therethrough. Alternatively, the crucible may be configured with openings configured to effect similar selectivity, as discussed in greater detail hereinbelow. In some embodiments, metallic baffles 13, 4 are disposed at proximal (e.g., bottom) and distal (e.g., top) ends, respectively, to facilitate control of the temperature gradient along the crucible longitudinal axis. One may selectively remove some of the baffles from the distal end relative to the proximal end to achieve the desired temperature gradient. The top set of baffles may include a center hole that facilitates temperature measurement at the tip of the crucible using a conventional pyrometer 1. If the operational conditions are adequate in terms of pressure, temperature, and displacement rate of the crucible respect to the gradient, a single crystal boule 7 is formed at the distal end of crucible 9, i.e. tip 19.

In various embodiments, this invention focuses on the arrangement of the shielding elements in the system that facilitates setting a desirable thermal gradient along the walls of push tube 3. As shown, in various embodiments, there are two distinct sets of shielding elements around the push tube. In a particular embodiment, the first set includes two concentric open joint tungsten cylinders 8, each having a thickness of less than about 0.005". Skilled artisans will readily recognize that other refractory metals such as molybdenum or rhenium may be substituted for tungsten.

As used herein, the term "open joint" refers to the cylinders 8 having an open longitudinal seam (i.e., the cylinders to not extend a full 360 degrees) so that there is no continuous electrical path around the cylinder. This serves to prevent the cylinders from coupling to the RF fields and becoming too hot and/or absorbing power intended for heating the crucible. Both the open joint and the thickness are chosen to minimize the coupling between these metallic parts and the electromagnetic field. In addition, in various embodiments, cylinders 8 are preferably axially shorter than RF coil 6 and located nominally in the center of the coil (e.g., both concentrically with the coil and equidistantly from both axial ends thereof) to avoid inducing local non-axial-symmetric hot spots on the shields. The second set of shields 10 preferably includes pyrolytic boron nitride (pBN) cylinders (e.g., in certain embodiments, between five and seven), which are preferably at least 0.050 inches (1.3 mm) thick and are several centimeters longer than the RF coil.

While one of the purposes of the pBN shields 10 is to thermally insulate the tube 3 to obtain the desire temperature in the work zone, the mission of the metallic shields is two-fold. Shields 8 serve as heat reflectors causing the temperature in the center of the hot zone to be much higher than at the coil ends. In addition, they serve to protect the push tube 3 from picking up boron generated by the continuous sublimation of the pBN shields 10. (Boron has a eutectic point with tungsten at the growth temperatures used in this invention if the boron concentration exceeds a certain value. Once the boron picked up by the push tube is higher than that value, a liquid phase tends to form on the skin of the push tube leading to its failure.) In various embodiments of the invention, the shielding arrangement described hereinabove advantageously produces a sharp thermal gradient on the crucible 9 (e.g., over 100° C./cm) as its tip 19 moves axially beyond the metallic shields 8. As discussed hereinabove, this relatively large gradient has been shown to facilitate large growth rates. As also shown, the shields 8, 10 may be enclosed in a dielectric tube 5, fabricated from quartz or other suitable material, to insulate the coil 6 from the metallic elements of the system and prevent arcing or other undesirable interactions with them.

Still referring to FIG. 2, in many embodiments of the invention, the furnace includes a crucible pedestal 12 disposed within push tube 3, for supportably engaging crucible 9 within tube 3. The push tube is itself supported by a push tube pedestal 14, which is engaged by a push rod 17 for axial actuation. Shielding pedestal 15 supportably engages pBN shields 10, and gas outlets and inlets 16 and 18, respectively enable vacuum/venting and pressurization.

In some embodiments of the present invention, the apparatus may also include a controller 24, such as one or more computers or microprocessors and related software, coupled to actuators and the like, suitable to automate at least some of the aspects the operation of the furnace. For example, as shown, controller 24 may be communicably coupled to heater 6 and to pyrometer 1 forming a conventional closed-loop system capable of maintaining chamber 5 at desired temperatures in response to execution of various temperature ramp routines by the controller. Controller 24 may be similarly coupled to a conventional vacuum pump 28, and to an electronically-activatable valve 30 disposed at gas outlet 16 to automatically effect evacuation and venting of chamber 2. The controller may also be coupled to valve 32 disposed at gas inlet 18 to effect pressurization of the chamber, while the controller is also coupled to an actuator 34 to automatically control operation of push rod 17. Skilled artisans will readily recognize that controller 24 may also be coupled to conventional pressure and position sensors (not shown) disposed within the chamber to provide closed-loop feedback to control the gas pressure and push rod position.

In still further embodiments, crucible 9 may be provided with one or more openings 20, 21 that allow the nitrogen partial pressure inside the crucible to be controlled by the nitrogen pressure outside the crucible, while minimizing the amount of Al vapor that escapes from the crucible. This goal may be accomplished by allowing the nitrogen to diffuse through a relatively thin-walled tungsten crucible, such as the one disclosed in the Slack reference cited above. Such a crucible may be welded shut so the only route for Al to escape the crucible is by diffusion through the walls. Since $N_2$ is able to diffuse through W much more rapidly than Al, this procedure was effective. In this event, the walls of the crucible need to be kept relatively thin to allow the $N_2$ inside the crucible to equilibrate with the $N_2$ outside in a reasonable amount of time. Otherwise, the time required to equilibrate (i.e., through relatively thick-walled crucibles) may be prohibitive. Disadvantageously, however, relatively thin-walled tungsten crucibles tend to have a lifetime that is too short to grow relatively large crystals. Other disadvantages of this thin-walled approach include the need to evacuate the crucible prior to electron-beam welding, and the expense of such welding.

Thus, embodiments of the present invention contemplate mechanical approaches to allow the nitrogen to equilibrate, while minimizing the escape of Al vapor. Turning now to FIGS. 3-4, in alternative embodiments, a two-piece crucible 9', which includes a base portion 25, which is threadably engageable with a tip portion 27, is employed. This approach includes providing (e.g., by drilling) a hole 20 in crucible 9' to allow nitrogen flow during heating phases 40, 44 (described hereinbelow), but which is small enough to allow only minimal diffusion of Al vapor through the hole once the total pressure in the crucible is equal to the total pressure outside the crucible. As best shown in FIG. 4, in a particular exemplary embodiment, this may be accomplished by drilling a 25-mil (0.63 mm) diameter hole 20 into proximal end 25 of crucible 9', (although it may also be provided elsewhere, such as in distal end 27) and then using a 20 mil (0.50 mm) diameter wire 23 to plug the hole. The nominally 0.13 mm clearance (best shown in FIG. 4) provided by this assembly has been shown to successfully allow the nitrogen pressure to equilibrate prior to growth and, during growth. Moreover, it is small enough so that the diffusion of Al vapor through it is acceptably low, or so small that it effectively becomes plugged during growth, to substantially prevent Al diffusion. Skilled artisans will readily recognize that this crucible 9' may be used with or without hole 20 and wire 23.

Figure 5:
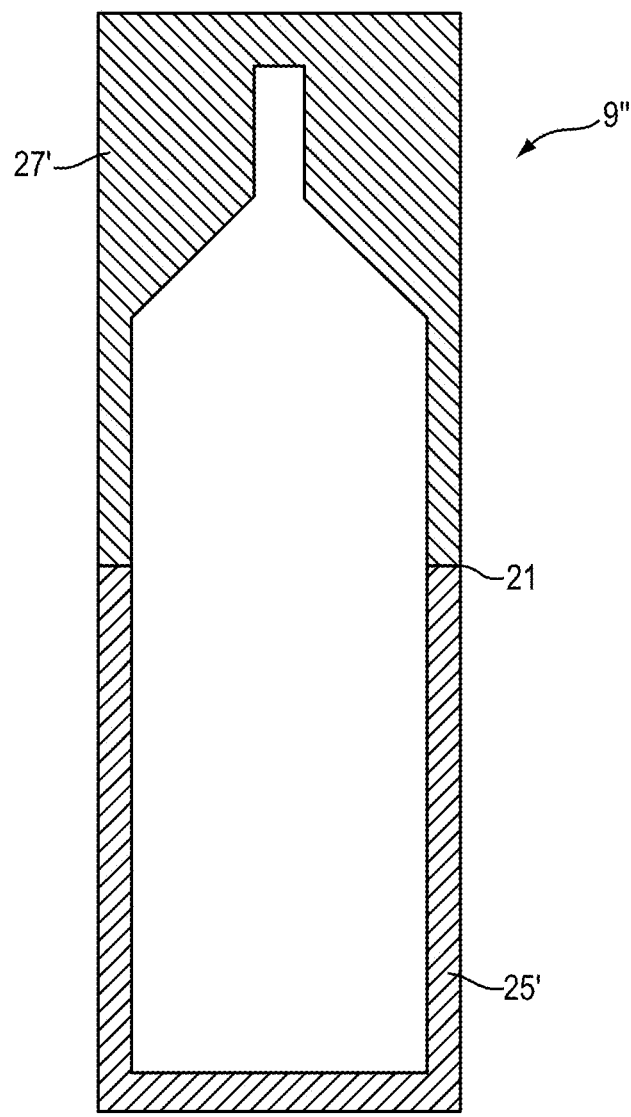
FIG. 5 is a schematic elevational view of another embodiment of the component of FIG. 3.

Turning now to FIG. 5, as mentioned above, another approach is to provide a horizontal-seal (opening) 21, by providing a two-piece crucible 9''' including the proximal end 25' containing source 11, and the distal end 27' containing crystal 7. The mating surfaces of the two ends that form seal 21 are configured to be sufficiently smooth so that there is little, if any, ability for gas to diffuse therethrough if the interior and exterior crucible pressures are at equilibrium. However, the seal 21 will permit (i.e., be unable to resist) gas flow from either inside the crucible or outside the crucible if the pressures are not substantially equal. As shown, the seal is disposed in a substantially central region of the crucible where no deposition of AlN will occur, e.g., by disposing the seal in the hottest region of the crucible 9' during crystal growth. This disposition of the seal effectively prevents the AlN growth from opening seal 21 and thereby permitting unacceptably high levels of Al vapor diffusion therethrough.

Having described the principles and apparatus of the present invention, the method of operation, i.e., the actual growth process using the system described above is now described in conjunction with the following Table 1.

TABLE 1

30 Evacuate chamber
32 Refill chamber with nitrogen gas
34 Repeat steps 30, 32
36 Pressurize chamber to I bar with a gas comprising about 95-100% N$_2$ and 0-5% H$_2$
37 Place source material in proximal end of crucible
38 Place crucible in tube, with its tip in the high-temperature region at proximal end of the shield
40 Increase temperature of the crucible to about 1800° C.
42 Maintain gas at a predetermined super-atmospheric pressure
44 Ram temperature to growth temperature TABLE 1-continued 46 During step 44, continuously adjust pressure to maintain it at the pressure of step 42
48 Once growth temperature is reached, pushrod is actuated to move crucible tip towards distal end of chamber
50 Maintain constant pressure during step 48
52 Stop movement of the push rod
54 Cool furnace to room temperature As recited in Table 1 above, in some embodiments, crystal growth initially involves evacuating the chamber 2 (FIG. 2) (step 30), e.g., to pressures on the order of about 0.01 mbar (1 Pa) using a vacuum pump. The chamber is then refilled with nitrogen gas (step 32). This step is preferably repeated several times to minimize oxygen and moisture contamination (step 34). The chamber is then pressurized to about l bar (100 kPa) with nitrogen gas which is preferably mixed with a small amount of hydrogen (step 36). For example, a gas including about 95-100% N$_2$ and 0-5% H$_2$ is suitable. In particular embodiments, a commercially-available mixture of about 3% H$_2$ and 97% N$_2$ is employed. Polycrystalline AlN source material is placed at a proximal end of the crucible (step 37). The crucible 9 may then be evacuated and sealed, or may be provided with openings as described hereinabove. The crucible is then disposed concentrically within the tube 3, with tip 19 in the high-temperature region of the furnace (i.e., nominally within the proximal end of shield 8) (step 38). The temperature is then increased to bring the tip of the crucible to a temperature of approximately 1800° C., in particular embodiments, within about 15 minutes (step 40). At the end of this temperature ramp, the gas pressure is set and maintained at a predetermined super-atmospheric pressure (step 42), and the temperature is ramped to a final crystal growth temperature (step 44), e.g., in about 5 hours. During this ramping, the pressure is continuously adjusted, e.g., using a vent valve (not shown) to maintain it at that fixed value (step 46). The goal of this ramping is to enhance the purity of the source material by permitting part of the oxygen still contained within it to diffuse out of the crucible (e.g., through the crucible walls). This diffusion occurs because the vapor pressure of the aluminum suboxides (such as Al$_2$O, AlO, etc.), generated due to the presence of oxygen in the source material, and is known to be higher than that of Al over AlN for the same temperature.

Once the growth temperature is reached, the push rod is actuated to move the crucible tip towards the distal end of the chamber, and relative to the thermal gradient (step 48). As discussed hereinabove, the crucible tip is initially located within the highest temperature region of the susceptor 3 at the beginning of the growth run. As the push tube moves upwards (i.e., towards the distal end of the furnace 2, tip 19 becomes cooler than the source material which promotes effective mass transport from the source material to the colder tip of the crucible. As shown in FIG. 2 and described above, the push tube, including crucible 9 disposed therein, is moved axially upon actuation of push rod 17. However, push rod 17 may alternatively be configured to move the crucible axially relative to the tube, without departing from the spirit and scope of the present invention.

During the growth process, the pressure is maintained at a constant predetermined value (step 50). The most appropriate value for this pressure typically depends on the axial spacing between the source material 11 and the (closest) surface of the growing crystal 7, as well as the rate of nitrogen diffusion through the crucible walls or flow through the predrilled holes. It may also be appropriate to actively adjust the gas pressure over a relatively narrow range during crystal growth to compensate for any changes in the spacing between the surface of the sublimating source and growing crystal surface.

In particular embodiments, a pressure of about 18 psi has been used to demonstrate growth rates of 0.9 mm/hr with the source material 11 to crystal surface 7 separation of approximately 2 cm, employing tungsten crucibles fabricated by either chemical vapor deposition or powder metallurgy technique (such as those described in commonly assigned U.S. Pat. No. 6,719,843 entitled "Power Metallurgy Tungsten Crucible for AlN Crystal Growth" which is fully incorporated by reference herein). The source to growing crystal surface distance may vary during the growth run if the area of the growing crystal surface is different than the surface area of the source material and the growth rate (i.e., axial rate of movement of the crucible through the temperature gradient) may need to be adjusted to account for this change. However, typically the surface area of the source and growing crystal surface will be kept nominally constant and approximately the same size so that the separation between the source and growing crystal surface will remain about constant during most of the growth.

Finally, the movement is stopped (step 52) and a cooling ramp (step 54) is established to bring the system to room temperature. Using pressures in the range 100 kPa to 150 kPa (1 atm to 1.5 atm); single crystal boules have been grown at an axial pushing rate ranging between about 0.4 and 0.9 mm/h, for example, at the rate of 0.455 mm/h. By adjusting the distance between the source material and the growing crystal surface, and by adjusting the temperature gradient, other useful growth conditions may be obtained. Hence, skilled practitioners may usefully use various embodiments of the present invention with total chamber pressures from 50 kPa to 1 MPa (0.5 atm to 10 atm) and axial pushing/growth rates of 0.3 to about 3 mm/h.

Advantageously, various embodiments of the present invention feature an AlN crystal growth system capable of controlling the $N_2$ partial pressure independently of the Al partial pressure, while substantially preventing significant amounts of Al from escaping from the growth crucible. These embodiments thus teach and facilitate use of partial nitrogen pressures greater than stoichiometric, and the use of total vapor pressures at super atmospheric levels (i.e., greater than one atmosphere).

Furthermore, by slicing or cutting the bulk AlN crystals of the present invention, crystalline AlN substrates of desired thickness—for example, about 500 μm or 350 μm—can be produced. These substrates can then be prepared, typically by polishing, for high-quality epitaxial growth of appropriate layers of AlN, GaN, InN and/or their binary and tertiary alloys to form UV LDs and high-efficiency UV LEDs. The aforementioned nitride layers can be described by the chemical formula $Al_xGa_yIn_{1-x-y}N$, where $0 \leq x \leq 1$ and $0 \leq y \leq 1-x$.

The surface preparation of the AlN is important to obtain high-quality epitaxial growth of the nitride layers on the AlN substrate. Surface damage is preferably carefully removed in order to obtain high-quality epitaxial layers needed for fabrication of high performance nitride semiconductor devices. One successful approach to remove surface damage from the AlN substrate is to employ a chemical-mechanical polishing (CMP) approach, e.g. as described in U.S. Pat. No. 7,037,838 (the "838 patent"), incorporated herein by reference. Through this approach, it possible to produce very high-quality epitaxial layers of $Al_xGa_yIn_{1-x-y}N$ using organometallic vapor phase epitaxy (OMVPE) with low dislocation densities, particularly when x exceeds 0.5. Those skilled in the art will recognize that other epitaxial growth techniques such as molecular beam epitaxy (MBE) or hydride vapor phase epitaxy (HYPE) may also be successfully employed to produce high-quality epitaxial layers on the low dislocation density AlN substrates of the present invention.

The present invention also features a method for making solid-state UV laser diodes and UV light emitting diodes, as well as the devices themselves. The LDs and LEDs are fabricated on AlN substrates made by the present process, preferably emitting at wavelengths ranging from about 200 nm to about 320 nm. Furthermore, the solid state UV LEDs fabricated via some of the embodiments of the claimed method exhibit high efficiency wherein the fraction of electric power converted into UV radiation (total energy per unit time delivered to the device) and then converted into UV radiation power (total energy radiated per unit time in the form of UV photons) exceeds 10%.

The process for fabricating these devices in compound semiconductors may include the following steps. Typically, a p-n junction is formed by growing p-type and then n-type (or vice-versa) epitaxial layers on an appropriate substrate. Metal contacts (preferably, ohmic contacts) are attached to the p-type and n-type semiconductor layers. The LED or LD functions by passing current through the device in the "forward direction." That is, a power source pushes electrons out of the n-type semiconductor toward the p-type semiconductor and holes out of the p-type semiconductor toward the n-type semiconductor. The electrons and holes recombine with each other to produce photons at a wavelength that is determined by the bandgap energy of the semiconductor region where the recombination occurs and may be shifted to somewhat higher energies by quantum confinement effects as well as by strain and impurities in the recombination region to higher or lower energies. Many factors may affect the efficiency of the LEDs. However, a very significant factor is the efficiency with which electrons and holes, once either generated or pushed out of their equilibrium positions, recombine to produce the desired radiation. In addition, LDs require an optical cavity to allow amplification by stimulated emission of the appropriate photons. This efficiency is improved by defining the region of recombination, often by creating one or more quantum wells. However, defects, such as dislocations, provide non-radiative recombination sites and may reduce the recombination efficiency. Most importantly, once the density of non-radiative recombination centers exceeds the typical diffusion length of carriers before they recombine, the loss in efficiency will become very significant and, as the density of defects is increased even further, the device may either perform badly, i.e. very inefficiently, or not at all.

As skilled artisans will readily recognize, the addition of In to III-N LED and LD devices facilitates localization of the free carriers away from non-radiative defects in recombination region probably through the formation of composition fluctuations where regions with higher In content have a somewhat smaller bandgap (and hence, are a lower energy region for the free carriers to localize). This enables visible LEDs (emitting in the wavelength range from 400 to 550 nm) to function even though the dislocation density is very high (exceeding $10^8$ cm$^{-2}$) (see, for example, J. Y. Tsao, Circuits and Devices Magazine, IEEE, 20, 28 (2004)). These high dislocation densities are the result of growing nitride epitaxial layers on foreign substrates such as sapphire (crystalline $Al_2O_3$) or SiC. The wavelength of emission from pure GaN is approximately 380 nm and decreases to 200 nm for pure AlN. Wavelengths in between these two end points can be achieved by alloying AlN with GaN. InN can also be introduced to make an $Al_xGa_yIn_{1-x-y}N$ alloy. While success has been achieved in making LEDs at wavelengths down to 250 nm, the efficiencies of these devices remains quite poor (<1%) (A. Khan, "AlGaN based Deep Ultraviolet Light Emitting Diodes with Emission from 250-280 nm," presented at the International Workshop on Nitride Semiconductors in Pittsburgh, Pa. (Jul. 19, 2004)).

Furthermore, low levels of dislocation densities in the substrate appear to be critical to the fabrication of high efficiency UV LDs and LEDs, particularly at wavelengths shorter than 340 nm (S. Tomiya, et al., "Dislocations in GaN-Based Laser Diodes on Epitaxial Lateral Overgrown GaN Layers," Phys. Stat. Sol. (a) 188 (1), 69-72 (2001); A. Chitnis et al., "Milliwatt power AlGaN quantum well deep ultraviolet light emitting diodes," Phys. Stat. Sol. (a) 200 (1), 88-101 (2003); M. Takeya, et al., "Degradation in AlGaInN lasers," Phys. Stat. Sol. (c) 0 (7), 2292-95 (2003), all incorporated herein by reference. Nitride semiconductor layers grown on sapphire substrates typically have dislocation densities of about $10^8$-$10^{10}$ cm$^{-2}$, and, recently, S. Tomiya et al. have produced ELO GaN substrates with dislocation densities of about $10^6$ cm$^{-2}$, as discussed in the aforementioned journal article. Furthermore, high-efficiency UV LEDs and UV LDs require layers of $Al_xGa_yIn_{1-x-y}N$ with relatively high aluminum concentration.

Higher efficiency LEDs have been recently fabricated on the AlN substrates prepared according to the embodiments of the present invention, exhibiting an improvement over an order of magnitude in photoluminescence efficiency of the low-defect layers grown on the substrates cut from bulk crystals fabricated in accordance with various embodiments of the present invention compared to the high-defect density epitaxial layers grown on sapphire (which has a defect density greater than 1,000,000 dislocations cm$^{-2}$). The improved results are believed to be due to the low levels of dislocations densities in substrates cut and prepared from bulk AlN crystals grown in accordance with various embodiments of the present invention. Specifically, as mentioned above, the present invention contemplates the fabrication of single crystals of AlN having dislocation defect densities of about 10,000 cm$^{-2}$ or less. In some embodiments, the dislocation densities are about 5,000 cm$^{-2}$ or less, or, more preferably, about 1,000 cm$^{-2}$ or less on average. In particular versions of these embodiments, the dislocation densities in at least some of the areas of the AlN crystal are about 500 cm$^{-2}$ or less, for example, as low as 100 cm$^{-2}$, with certain regions—for example, exceeding 5×5 mm$^2$—being substantially devoid of dislocation defects, i.e. having no visible dislocations at all. This low dislocation density can be measured by Synchrotron White Beam X-ray Topography (SWBXT) (See B. Raghothamachar et al., J. Crystal Growth 250, 244-250 (2003); and L. J. Schowalter et al., Phys. Stat. Sol. (c) 1-4 (2003)/DOI 10.1002/pssc.200303462), both articles incorporated herein by reference.

Figure 6:
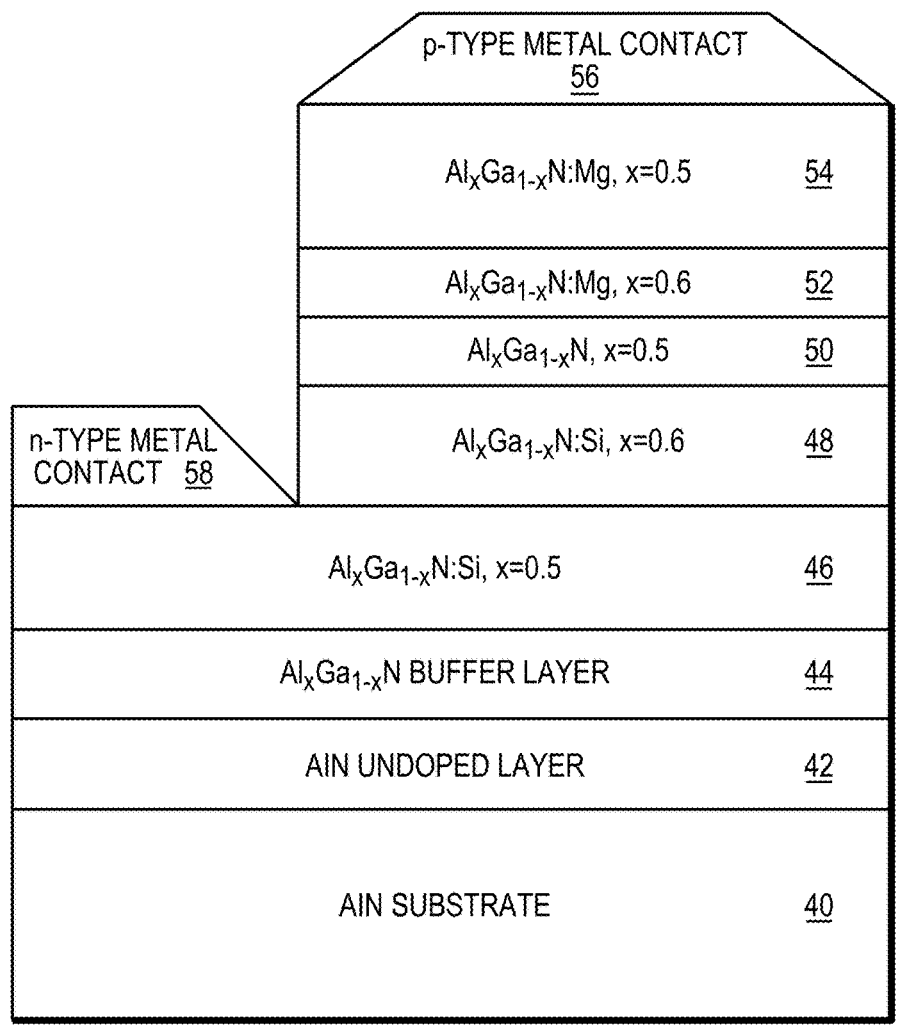
FIG. 6 is a cross-sectional view of a portion of a device fabricated using the method of the present invention.

FIG. 6 and the following example illustrate the fabrication of an exemplary UV LD emitting at a wavelength of 260 nm using conventional techniques. The LD is disposed on a low dislocation density AlN substrate formed according to some of the embodiments of the present invention. The orientation of the AlN substrate in the example is c-face, Al polarity. However, as one of ordinary skill will readily recognize, other orientations, such as N polarity, m-face, and a-face, could be used instead, depending on the desired application. Furthermore, as one of ordinary skill will also recognize, many other LD and LED devices emitting at various other wavelengths can alternatively be prepared by the method disclosed herein. In addition, the substitution of multiple quantum wells in the active region as well as patterning the surface to laterally confine the radiation in the quantum wells are well-known procedures to enhance the performance of the laser diode. The example is included to illustrate the fabrication of one such device, and the invention is not limited to the device illustrated in the example.

Example—260 nm Laser Diode Fabrication

FIG. 6 is a schematic cross-sectional view of a portion of a 260-nm laser diode fabricated using the method of the present invention. Initially, low defect density AlN substrate 40, which is prepared using the method discussed above, is polished by CMP. The polished substrate is then introduced into a conventional OMVPE system. The surface of the low defect density AlN substrate is cleaned to remove any oxide or other impurities on the crystal surface by heating the substrate at a temperature of 1150° C. for 20 min under ammonia plus nitrogen or hydrogen plus nitrogen flow prior to growth. An epitaxial layer 42 of AlN having a thickness of about 100 nm is then grown on the substrate to improve its surface quality before starting to grow the device layers. Next, an undoped $Al_xGa_{1-x}N$ buffer layer 44 having a thickness of approximately 1 μm is grown atop the epitaxial AlN layer to relieve lattice mismatch through the formation of misfit dislocations. Formation of threading dislocations, which will continue to propagate through the device layers, is minimized by grading x from 1 to the final value of 0.5 (i.e. to 50% Al concentration). Onto the buffer layer, a 1-μm thick layer 46 of Si-doped $Al_xGa_{1-x}N$ (x=0.5) is then grown to provide the n-type contact to the LD. A 50-nm thick layer 48 of Si-doped $Al_xGa_{1-x}N$ (x=0.6) is then grown onto the Si-doped $Al_xGa_{1-x}N$ (x=0.5) layer 46, followed by the growth of a 10-nm thick layer 50 of undoped $Al_xGa_{1-x}N$ (x=0.5). Then, a 50-nm thick layer 52 of Mg-doped $Al_xGa_{1-x}N$ (x=0.6) is grown onto the layer 50 followed by the growth of a 1-pm thick layer 54 of Mg-doped $Al_xGa_{1-x}N$ (x=0.5). After the growth steps, the substrate 40 (now having epitaxial layers 42, 44, 46, 48, 50, 52 and 54 thereon) is slowly ramped down from the growth temperature of about 1100° C. and removed from the OMVPE system. In some embodiments, the top surface of epitaxial layer 54 is then coated with a metal contact layer 56 for the p-type semiconductor, and metal layer is coated with a photoresist (not shown), which is then developed. The photoresist is removed where the n-type metal contact 58 will be formed. The substrate, along with the epitaxial layers and the metal layer thereon, are then etched such that the semiconductor is removed down to the n-type layer 46, which will be used for the n-type metal contact 58. A second coating of photoresist (for lift off) (not shown) is deposited, which is then patterned and removed where the n-type contacts are desired. The n-type metallization is now complete, and the metal coating adjacent the second photoresist layer is removed to produce the desired wafer. Laser facets are achieved by cleaving the wafer. These facets may optionally be coated to protect them from damage. Wire bonding contacts (not shown) are made to the p-type and n-type metal layers and the laser diode is packaged appropriately. In other embodiments, the mesa etching and n-contact fabrication precedes p-type contact metallization due to the higher annealing temperature for the n-type contact (~900° C.) compared to the p-contact anneal at ~600° C.

The growth of the bulk single crystal of AlN has been described herein primarily as being implemented by what is commonly referred to as a "sublimation" technique wherein the source vapor is produced at least in part when crystalline solids of AlN or other solids or liquids containing AlN, Al or N sublime preferentially. However, as also disclosed herein, the source vapor may be achieved in whole or in part by the injection of source gases or like techniques that some would refer to as "high-temperature CVD". Also, other terms are sometimes used to describe these and other techniques that are used to grow bulk single AlN crystals according to this invention. Therefore, the terms "depositing," "depositing vapor species," and like terms will sometimes be used herein to generally cover those techniques by which the crystal may be grown pursuant to this invention.

Thus, the AlN boules fabricated using the embodiments described hereinabove may be used to produce substrate by cutting a wafer or cylinder from the bulk single-crystal AlN, preparing a surface on the wafer or cylinder in a known manner to be receptive to an epitaxial layer, and depositing an epitaxial layer on the surface using conventional deposition techniques.

In particular embodiments of the invention, large, e.g. greater than about 25 mm in diameter, single-crystal AlN wafers are produced from single-crystal AlN boules having a diameter exceeding the diameter of the final substrate, e.g. boules having a diameter greater than about 30 mm. Using this approach, after growing the boule and orienting it, e.g. by employing x-ray Laue diffraction technique, to obtain a desirable crystallographic orientation for the wafer, the boule is mechanically ground down to a cylinder having a desirable diameter and then sliced into individual wafers, e.g., using a wire saw. In some versions of these embodiments, the boules can be grown by, first, producing high-quality single-crystal seeds, and then using the seed crystals as nuclei to grow larger diameter single-crystal boules through a crystal expansion growth run. It is then possible to take large-diameter slices from this second crystal growth process and use them to grow large-diameter crystals without diameter expansion. In alternative versions, the crystal growth is self-seeded, i.e. the crystal is grown without employing single-crystal seeds. Various versions of the above embodiments are described in more detail below.

Self-Seeded Crystal Growth

Figure 7:
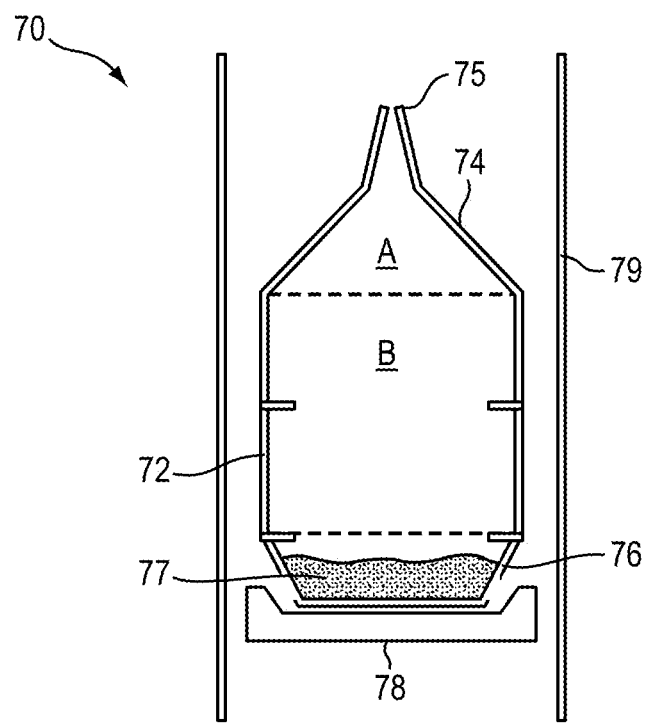
FIG. 7 is a schematic elevational view of yet another embodiment of an apparatus of the present invention.
Figure 8:
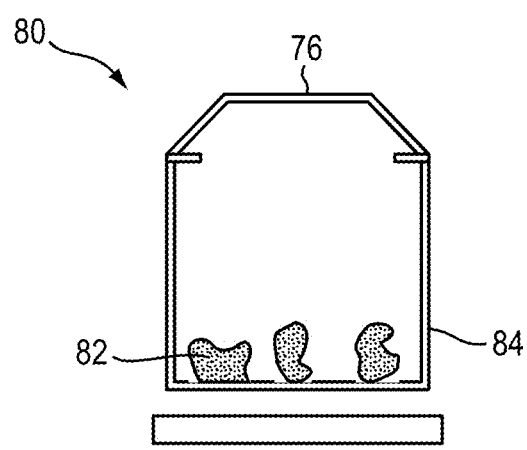
FIG. 8 is a schematic elevational view of a crucible for producing a high-purity source material in the source base crucible portion suitable for use with the apparatus of FIG. 7.

Referring to FIGS. 7-8, in some embodiments, an apparatus 70 for self-seeded growth of single-crystal AlN boules includes a crucible 72 having a conical crucible portion 74, such as the one disclosed in U.S. Pat. No. 6,719,842 ("the '842 patent"), incorporated herein by reference, consisting essentially of tungsten and fabricated by a CVD process. Multiple grain layers within the wall of the conical portion can be obtained by interrupting the tungsten deposition several times before the final wall thickness was obtained. Other crucible materials can be used such as tungsten-rhenium (W—Re) alloys; rhenium (Re); tantalum monocarbide (TaC); a mixture of $Ta_2C$ and TaC; a mixture of $Ta_2C$, TaC and Ta; tantalum nitride ($Ta_2N$); a mixture of Ta and $Ta_2N$; hafnium nitride (HfN); a mixture of Hf and HfN; a mixture of tungsten and tantalum (W—Ta); tungsten (W); and combinations thereof. In certain versions of these embodiments, a tip 75 of the conical portion has a narrow angle, for example, about 15°. The apparatus further includes a source base crucible portion 76, having an AlN source 77, for example, consisting essentially of high-purity AlN ceramic disposed therein. In various embodiments, the source base crucible is fabricated from tungsten and is prepared from a high-density, powder metallurgy cylinder hollowed out by electric discharge machining. Thus fabricated, the base crucible portion includes a plurality of grains arranged in multiple layers within the wall of the crucible.

Referring to FIG. 8, the high-purity source material in the source base crucible portion 76 can be produced in a crucible 80 by reacting high-purity Al (e.g. having 99.999% purity, available from Alpha Aesar of Ward Hill, Mass., USA) with high-purity $N_2$ gas (e.g. having 99.999% purity, available from Awesco of Albany, N.Y., USA). In a particular version, chunks of high-purity AlN ceramic 82, e.g. weighing about 9 g or less, are placed in a bottom portion 84 of the crucible 80 and heated to about 2300° C. in a forming gas atmosphere in order to sublime the AlN and recondense it in the source base portion 76. As a result, the density of the resulting ceramic can be increased to approximately theoretical density by sublimation transport to decrease the surface area relative to the volume of the source material. The resulting AlN ceramic material may have impurity concentration of less than about 500 ppm.

Referring again to FIG. 7, in various embodiments, the source base and conical portions are then assembled together, e.g. employing a horizontal seal, forming the crucible 72. The mating surfaces of the source base and the conical portion are preferably treated prior to assembly by polishing with a diamond grit (e.g. by a 15 micron grit followed by 1 micron grit) on a polishing wheel and then by 1200 grit SiC sand paper until extremely smooth to improve quality of the joint.

The crucible loaded with the source material can then be assembled in the furnace, e.g. high-pressure crystal growth furnace available from Arthur D. Little, Inc. In a manner analogous to the embodiments of the apparatus described above in connection with FIGS. 2-5, the crucible can be placed on a pedestal 78 in a push tube 79. Both distal and proximal axial radiation baffles (not shown) may then be installed around the crucible with the tube around the crucible and axial shields. The radial shields can then be loaded along with the pedestal mount. The crucible is preferably positioned with respect to the radial shield geometry such that the nucleation tip is below the location of the sharp gradient created by the reflective metallic shields, and the tip initially is maintained at a higher temperature than the source material so that little or no nucleation occurs during a warm-up.

The growth chamber is then closed and evacuated, as described above, to reduce trace atmosphere contamination of the nucleation process and resulting AlN boule. In various versions of these embodiments, following evacuation, e.g. to less than about 1 Pa employing a mechanical Welch pump with minimum pressure of about −0.5 Pa, the chamber is filled with a forming gas blend of 3% $H_2$ and 97% $N_2$ to a pressure of about 100 kPa and then evacuated again to less than 10 mTorr. This refill and pump process can be carried out three times or more to reduce chamber contamination. Following the pump and refill processes, the chamber is filled with the forming gas to a pressure of 117 kPa. High-purity grade gas available from Awesco (99.999% certified) can be used to further ensure a clean growth chamber atmosphere.

During a ramp to the growth temperature, the pressure in the chamber increases until the target growth pressure of 124 kPa is reached. After reaching the operating pressure, the chamber pressure can be periodically checked and incrementally adjusted by releasing gas from the chamber to a vent line in order to keep the chamber pressure between 124 kPA and 125 kPa.

In some embodiments, the power supply is an RF oscillator with a maximum power output of 40 kW at 450 kHz. The power output of this machine is preferably controlled with saturable reactors driven through a GPIB interface with a Keithly ABC 0-3 amp DC current supply. The growth temperature inside the furnace can be increased in two ramp segments. For example, the first segment of the ramp can be linear for about 15 minutes taking the top axial optical pyrometer temperature to about 1800° C. The second ramp segment can then be linear for approximately 4 hours taking the top axial temperature to about 2200° C. The chamber can be then maintained at growth temperature and pressure for a period of about 1 hour. Then, the crucible is moved up by the push rod at a rate of, for example, approximately 0.63 mm/hr. During the growth run, this push rate is held constant, such that the total travel is about 32 mm, producing a single-crystal AlN boule that reached about 35 mm in length and about 11 mm in diameter. Shorter or longer crystals can be produced by varying the travel distance (which is directly related to the push time). Following completion of the vertical travel of the crucible, the current through the saturable reactors of the oscillator is ramped down (which decreases the power to the furnace), e.g. from 1.4 A to 0.7 A in 20 hrs. Once the saturable reactor current reaches 0.7 A, it can be quickly reduced to 0. Once the system is at room temperature, the chamber can be pumped to less than 1 Pa and backfilled to atmospheric pressure with the forming gas, allowing the chamber to be opened and the growth crucible assembly removed from the furnace for evaluation.

In the embodiments of the invention described above, a crucible tip having a narrow tip is employed so as to minimize the number of nuclei that form in the tip during the nucleation stage. In some versions, a single nucleus fills the narrow tip, such that a single crystal forms in the tip. In addition, in many embodiments, the orientation of the crystal is close to having its c-axis along the growth direction.

It has been experimentally confirmed that the single-crystal AlN material produced in accordance with implementations of the embodiments described above to be of very high quality. Total dislocation densities were found to average 1,000 cm$^{-2}$, with some regions of the single crystal having between 100 and 500 dislocation per cm$^2$ and other regions, including those exceeding 5×5 mm$^2$, having no visible dislocations at all. Triple-crystal x-ray rocking curve widths were observed to be less than 15 arcsec and were typically limited by instrument resolution.

Seeded-Crystal Growth Using an Encased Seed

In some embodiments, single-crystal AlN boules up to about 50 mm in diameter are grown by employing an encased AlN seed prepared by the self-seeded growth process described above. In these embodiments, the tip of the conical crucible used in the self-seeded process is cut off once it is filled with an AlN single crystal. In many versions of these embodiments, the tip is cut off to a length of approximately 15 to 20 mm. At this length, the cross-section of the AlN single crystal is approximately 5 to 7 mm in diameter.

In these embodiments, the crucible is fabricated and assembled as described above in connection with FIGS. 7-8 with the cut-off tip of the self-seeded growth crucible filled with a single crystal of AlN, i.e. an encased AlN boule, disposed in a top portion of the crucible. Similar to the embodiments described above, a source of high purity AlN, e.g. having an impurity concentration lower than 500 ppm by weight, is placed in a bottom portion of the crucible. As described above, the AlN material in the source base is preferably formed from very high-purity chunks of AlN ceramic prepared by reacting pure Al with pure nitrogen and using sublimation transport to achieve near theoretical density of AlN ceramic in the source cup. During fabrication, the single crystal of AlN grows on the surface of the encased AlN seed and expands in diameter into a first expansion zone A and then a second expansion zone B of the crucible.

The furnace used to grow the single crystal self-seeded material described above may not be large enough to grow crystals larger than about 20 mm in diameter. Thus, for the larger-diameter crystals, a Hamco furnace coupled to a 450 kHz, 100 kW power supply can be employed. The arrangement of the RF coil and the radiation shield is the same as described above.

In various embodiments of the invention, the crucible shown in FIG. 7 is placed into the furnace in a manner discussed above in connection with FIG. 2. At this point, both distal and proximal axial radiation baffles are installed around the crucible with the tube around the crucible and axial shields. The radial shields are then loaded along with a pedestal mount. The crucible is preferably positioned with respect to the radial shield geometry such that a seed equilibrium position (SEP) was achieved. This means that once the furnace is heated to the growth temperature, the seed crystal will neither grow nor shrink while it is positioned at the SEP. The SEP can be determined experimentally and depends on the growth temperature used.

The growth chamber is then closed and evacuated as described above to reduce trace atmosphere contamination of the growth cell, nucleation process and resulting AlN boule. In particular versions of these embodiments, following pump-down to less than 7 mPa, e.g. using a turbo pump with a minimum pressure of about 0.4 mPa, the chamber is filled with a forming gas blend of 3% $H_2$ and 97% $N_2$ to a pressure of about 122 kPa. Following the pump and refill process, the chamber is filled with the forming gas for the start of the growth process to a pressure of 117 kPa. As described above, a high-purity grade gas available from Awesco (99.999% certified) can be used to further ensure a clean growth chamber atmosphere.

During a ramp to the growth temperature, the pressure in the chamber increases until the target growth is reached. After reaching the operating pressure, the chamber pressure can be periodically checked and incrementally adjusted by releasing gas from the chamber to a vent line in order to keep the chamber pressure between 124 kPa and 125 kPa.

The growth temperature inside the furnace can be increased in two segments. For example, in the first segment, the temperature is linearly increased from the room temperature to about 1800° C. in 30 minutes. Then, the second ramp segment to the final growth temperature determined by the optical pyrometer, e.g. for three hours, can be initiated after operator inspection. The growth temperature can be within 50° C. of the tungsten eutectic temperature (in the presence of AlN at 124 kPa total pressure). This eutectic temperature can be used to calibrate the optical pyrometer used to control the temperature during the growth run.

The chamber is then maintained at the growth temperature and pressure for a period of, for example, 1 hour. The vertical drive then pushes the crucible up at a rate ranging from about 0.4 to 0.9 mm/hr, for example, at approximately 0.455 mm/hr. In a particular version, during the growth run, this push rate is held constant and the total travel is about 35 mm, producing a single crystal AlN boule that reached about 50 mm in diameter and 35 mm in length. Shorter or longer crystals can be produced by varying the distance the crucible is pushed or equivalently by varying the push time.

Following completion of the vertical travel, the vertical motion of the crucible is stopped and the pressure of the furnace is increased to 157 kPa by adding more high-purity forming gas. The power to the furnace is then linearly reduced to zero, for example, in 6 hrs and the system is allowed to cool to room temperature. Following the cool down, the chamber is pumped to, e.g., less than about 1 mPa and backfilled to atmospheric pressure with forming gas. The chamber is then opened and the growth crucible assembly removed from the furnace for evaluation.

Figure 9:
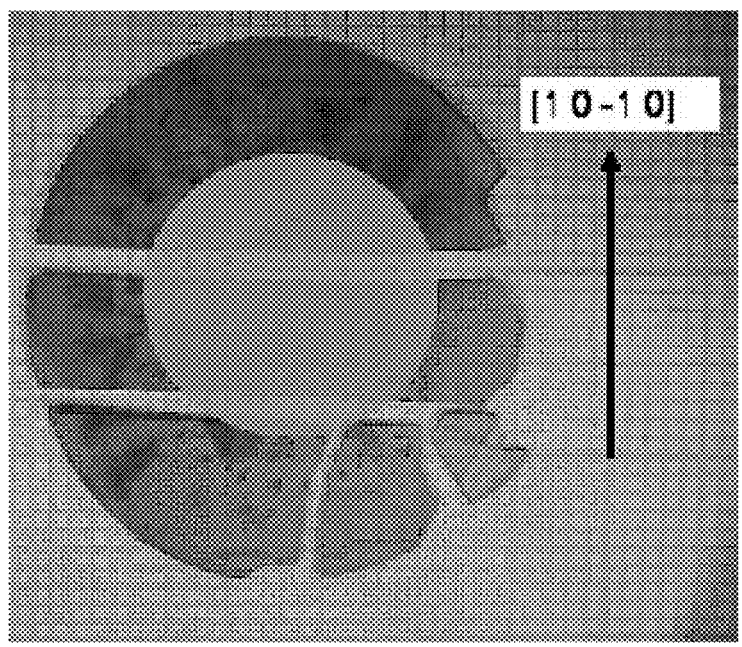
FIG. 9 depicts an AlN single-crystal wafer fabricated in accordance with the embodiments of the invention shown in FIGS. 7-8.

In various embodiments, after orienting the resulting AlN boule, e.g. by employing the x-ray Laue diffraction technique, the boule is encased in epoxy, e.g. VALTRON available from Valtech, and then ground down to a 25-mm diameter cylinder having its longitudinal axis oriented along the desired crystallographic direction. Once the oriented cylinder is produced, it is once again examined by the x-ray Laue diffraction technique to determine precise orientation (within +/−0.2°) and then sliced with a wire saw, e.g. the Model DT480 saw, for example, the one available from Diamond Wire Technologies, into a wafer shown in FIG. 9. Those skilled in the art of semiconductor wafer preparation will readily recognize that there are many alternatives for slicing the AlN crystal using diamond-coated ID and OD saws. The surface of the wafer is then prepared for epitaxial growth utilizing, for example, one or more techniques described in the '838 patent.

Seeded Growth Using Polished AlN Wafers

To improve the quality of the single-crystal AlN for certain applications, it is desirable able to determine the orientation of the seed crystal by mining it from a source bulk crystal. Accordingly, in some embodiments, a piece of AlN material having a known crystallographic orientation is used as a seed from which bulk material can then be grown. In order to further increase the diameter of the bulk crystal, in certain versions of these embodiments, several seeds are mounted next to each other such that crystallographic directions of these seeds are substantially aligned. Bulk crystals grown thereover may exhibit certain mosaicity, i.e. regions with slightly different orientations, but this effect can be minimized by choosing appropriate growth conditions. In a particular embodiment, a polished AlN wafer sliced from a bulk crystal is employed as a seed, offering a number of benefits, including standardization and improved control over the growth direction.

In order to grow high-quality AlN crystals, very high temperatures, for example exceeding 2100° C., are generally desirable. At the same time, as discussed above, high thermal gradients are needed to provide sufficient mass transport from the source material to the seed crystal. If not chosen properly, these growth conditions can result in evaporation of seed material or its total destruction and loss.

Figure 10:
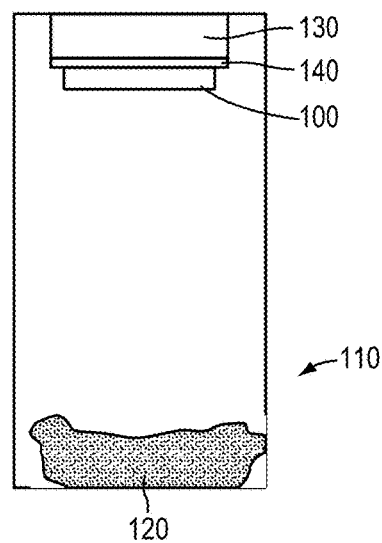
FIG. 10 is a schematic diagram of an apparatus for seeded bulk crystal growth of AlN, according to alternative embodiments of the invention.

Preferably, the mounting technique employed in these embodiments to secure AlN seeds entails:
(1) employing a seed holder and/or adhesive compound that is sufficiently strong to secure the seed and the crystal being grown;
(2) protecting the opposite side of the seed during growth to avoid re-evaporation of the AlN, as this may result in formation of planar and/or extended void defects; and
(3) avoiding contamination of the crystal and the crucible by the material chosen to protect the opposite side of the seed or as the adhesive;

FIG. 10 schematically depicts one exemplary embodiment of the apparatus for seeded bulk crystal growth. An AlN wafer 100 having a thickness of approximately 500 μm is used as a seed. The AlN wafer is sliced from a bulk AlN crystal and polished utilizing, for example, one or more techniques described in the '838 patent. This approach enables growth of AlN single-crystal boules with a predetermined seed orientation. In addition, either the nitrogen polarity or aluminum polarity can be used for c-face seed orientations where the seed face is oriented parallel to the (0001) plane. A seed which oriented with its face parallel to the (11$\bar{2}$0) (the so-called a-plane) or with its face oriented parallel to the (10$\bar{1}$0) (the so-called m-plane) will allow the growth of boules from which it will be easier (with less material waste) to cut substrates with these special orientations. The a-plane and m-plane substrates will have non-polar surfaces which are particularly desired for various kinds of electronic and opto-electronic devices which can have superior properties over devices grown on polar substrates. An example of a superior device property includes the elimination of the spontaneous polarization and piezo-electric fields in the quantum wells used for light emitting diodes (LEDs) and laser diodes (LDs). Another example, is the enhanced impact ionization anisotropy for electrons and holes moving along the nitride semiconductor basal plane which is desirable for avalanche photo diodes and would be facilitated by a-plane or m-plane substrates.

In some embodiments, the AlN seeded bulk crystal growth is carried out in the tungsten crucible 110 using a high-purity AlN source 120, for example, as described above in connection with FIGS. 7-9. The tungsten crucible is placed into an inductively heated furnace, as described above, so that the temperature gradient between the source and the seed material drives vapor species to move from hotter high purity AlN ceramic source to the cooler seed crystal. The temperature at the seed interface and the temperature gradients are monitored and carefully adjusted, if necessary, in order to nucleate high-quality mono-crystalline material on the seed and not destroy the AlN seed.

Preferably, the AlN seed is mounted onto a holder plate 130 using an AlN-based adhesive 140. Using an adhesive for seed mounting generally simplifies the fabrication procedure and improves the seed back protection and mechanical adhesion. The AlN ceramic adhesive may contain at least 75% AlN ceramic and silicate solution that provides adhesive properties. One suitable example of such an adhesive is Ceramabond-865 available from Aremco Products, Inc.

In a particular version, the AlN seed is mounted using following procedure:
(1) AlN adhesive is mixed and applied to the holder plate using a brush to a thickness not exceeding about 0.2 mm;
(2) The AlN seed is placed on the adhesive; and then
(3) the holder plate along with the seed is placed in vacuum chamber for about 12 hrs and then heated up to 95° C. for about 2 hrs.

Alternatively, the AlN seed can be mounted on a thin foil of Al on the holder plate. The Al is melted as the temperature of the furnace is raised above 630° C. (the melting point of Al), wetting the back of the seed and the holder plate. As the temperature is raised further, the Al will react with $N_2$ in the furnace to form AlN and will secure the seed to the holder plate. This technique may require that the AlN seed be held in place (either by gravity or mechanically) until a sufficient amount of the Al has reacted to form AlN which will secure the seed to the holder without further need of mechanical support.

Figure 11A:
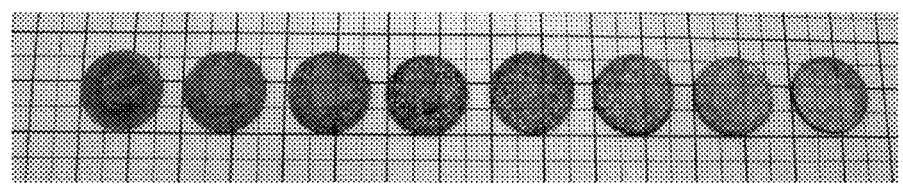
FIG. 11A depicts a set of AlN single-crystal wafers fabricated in accordance with the embodiments of the invention shown in FIG. 10.

Referring to FIG. 11A, in one particular embodiment, a predominantly single-crystal boule having a diameter of about 15 mm was grown using a polished AlN wafer sliced from a bulk crystal as a seed as described above and then sliced into wafers approximately 1 mm thick. The first slice (at the left) shows the original seed crystal (which was approximately 10 mm in diameter) in the center. This seed crystal propagated through the boule as seen in the center sections of subsequent slices. The boule can be made single crystal by using a seed crystal of the same diameter as the desired boule. Larger seed crystals can be produced using the techniques described above. In another embodiment, multiple seed crystals are mounted and carefully oriented in the same direction to increase the size of seeded region.

Figure 11B:
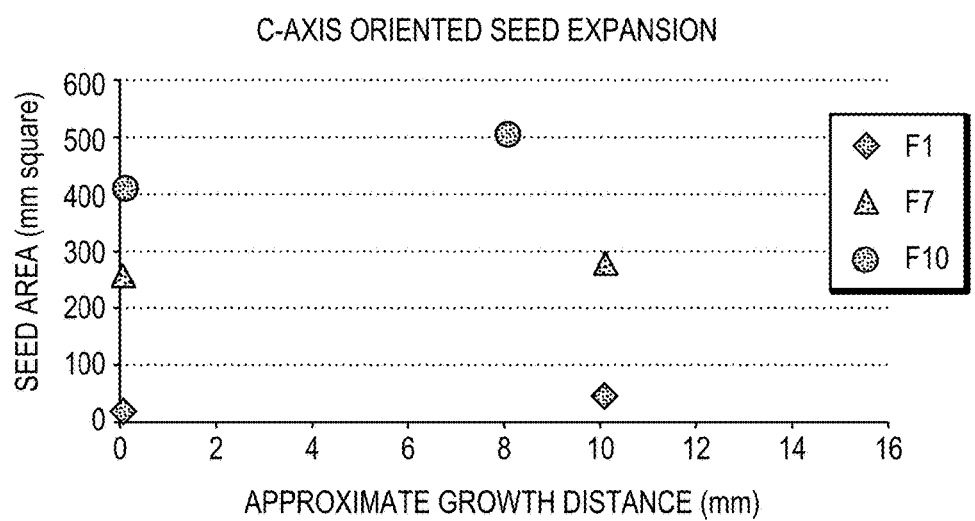
FIG. 11B is a plot representing seed area expansions between 25-50% with relatively small area seeds.

In yet another embodiment, the size of the seeded region has been expanded during growth as described below. The seed expansion has been done starting with smaller seeds, with faces parallel to the (0001) plane, mounted on a tungsten plate in a furnace designed to grow boules that are 2.4" (61 mm) in diameter. Under proper growth conditions, it has been found that the seeded region of the resulting boule can be increased as shown in FIG. 11B. The (0001) orientation (the so-called c-face) was used because growth in the a-b plane perpendicular to the c-axis is expected to be more rapid than along the c-axis, making a c-face seed easier to expand. The proper conditions are a combination of several additional factors including the self-seeded nucleation barrier and the use of thermal gradient factors to aid in the seed crystal area expansion with increasing growth distance. Brief descriptions of both of these conditions are given below.

Self-Seeded Nucleation Barrier:

There is a nucleation barrier to the growth of AlN on tungsten. That is, the vapor above the tungsten crucible will tend to be supersaturated unless AlN nuclei are available for growth. Some embodiments of the present invention takes advantage of this by having a seeded region take up some part of the full diameter seed mounting plate which is surrounded by an unseeded, bare region. Since adsorption of aluminum and nitrogen from the vapor onto the seed is favored over deposition on the bare crucible wall, the seed is favored to expand laterally in favor of creating new self-seeded critical nuclei next to the seed. Under properly controlled conditions this process can be used to increase the seeded area per growth cycle.

Thermal Gradient Factors:

The process of crystal growth requires heat extraction which is controlled by arrangements of insulators/heaters in the system. Properly arranging insulations so that the seed is the coolest part of the upper crucible and cooler than the source during growth is important to the process. Further tailoring this insulation when using a small seed to be expanded during the growth aids in expansion of the seed by making the seed cooler than the unseeded lateral region. This thermal arrangement makes self-seeded nucleation's neighboring the seed less favored by limiting heat extraction. As the crystal grows at high temperature and with sufficient source material, given sufficient time to reach an equilibrium point during the growth run the interface of the crystal will follow the isotherms of the system (insulation/heaters etc). The proper interface shape to favor seed expansion is slightly convex in the growth direction—the curvature of the gradient will aid expansion.

The plot depicted in FIG. 11B shows a collection of data documenting this behavior, the legend on the chart referencing the boule number or production number of the growth run. The significance of this expansion, along with a high quality of the grown material, is that a small seed sequentially grown out by this process generally yields larger, higher quality seeds (or substrates) in each process cycle. Reprocessing and reseeding with this expanded material is one path to achieving large diameter seeded growth.

Figure 11C:
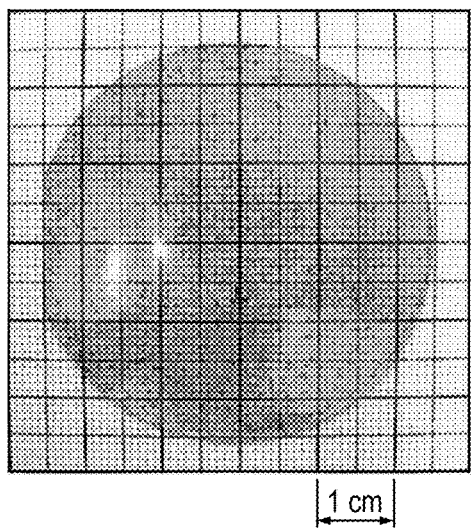
FIG. 11C depicts another AlN wafer fabricated in accordance with the embodiments of the invention shown in FIG. 10.

Referring to FIG. 11C, in another particular embodiment of the invention, a two-inch diameter AlN substrate, approximately 0.5 mm thick, was cut from a 2.4" boule grown as described above. The 2.4" boule was ground down to 2" diameter before slicing.

Defect Density in Pseudomorphic Epitaxial Layers

As discussed above, the AlN boules grown by the techniques disclosed herein have very low dislocation densities—under 10,000 cm$^{-2}$, typically about 1,000 cm$^{-2}$, and, in certain embodiments, under 500 cm$^{-2}$ and even under 100 cm$^{-2}$—enabling fabrication of highly-efficient UV LEDs and LDs, as well as electronic devices, such as transistors for high frequency (>2 GHz), high power operation. However, the lattice mismatch between pure AlN and pure GaN of about 2.3% may result in a high threading dislocation density if thick layers of either GaN or low-Al-content $Al_xGa_{1-x}N$ layers are grown on the low dislocation density substrate. However, thin pseudomorphic GaN and $Al_xGa_{1-x}N$ can be grown with significantly reduced defect densities. As a result, pseudomorphic devices grown on closely-matched AlN substrates may include epitaxial layers with levels of defect densities similar to those of the underlying substrate. Thus, use of thin, pseudomorphic layers broadens the range of low defect device structures significantly, allowing for enhanced performance and increase device reliability in many new nitride devices, as discussed in more detail below.

Figure 12:
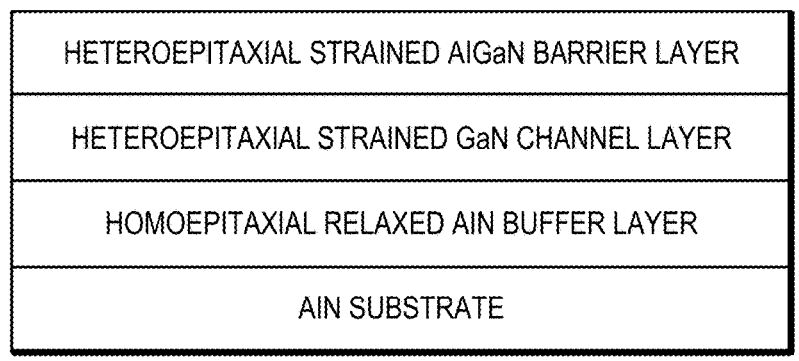
FIG. 12 is a schematic diagram depicting several device layers epitaxially grown on an AlN substrate fabricated in accordance with various embodiments of the invention.

In various embodiments, thin GaN and $Al_xGa_{1-x}N$ epitaxial films are grown pseudomorphically, eliminating the formation of misfit dislocations and resulting in an overall reduction of defects that are commonly observed in these films grown on foreign substrates such as sapphire, SiC and silicon. The key is defect reduction by keeping the entire structure lattice-matched to AlN lattice parameter perpendicular to the growth direction. Since GaN and $Al_xGa_{1-x}N$ layers have intrinsically larger lattice parameter, this can only be accomplished by straining the epitaxial layer. In a so-called pseudomorphic layer, the strain in the plane parallel to the substrate surface is exactly equal to the lattice mismatch between the AlN substrate and intrinsic lattice parameter of the epitaxial layer. A schematic cross-section of one exemplary epitaxial profile is shown in FIG. 12, indicating the pseudomorphic layers fabricated in accordance various embodiments of the invention.

From simple calculations where the strain energy in the pseudomorphic layer is balanced against the extra energy involved in creating dislocations, the critical layer thickness for different lattice mismatches (which, in this case, is controlled by the percentage of GaN in the epitaxial layer) can be calculated. (See, for example, Matthews and Blakeslee in the J. Crystal Growth 27, 118 (1974)). The AlGaN supply layers (~60% Al) can be 40 nm thick and remain pseudomorphic. At 50%, the critical thickness goes down to 30 nm. The critical thickness of pure GaN is estimated to be 12.5 nm with respect to AlN. In reality, slightly thicker pseudomorphic layers can typically be grown because the formation of strain-relieving misfit dislocations is kinetically hindered. In addition, putting one or more additional AlN epitaxial layers at the top of the device structure as a buffer may also help stabilize the pseudomorphic layers with low dislocation densities.

Two different device structures can be considered that have different physical properties in addition to the defect density reduction as previously described. The first kind of structure is pseudomorphic and grown on non-polar faces, including a- and m-plane crystal orientations as defined by the AlN substrate. This minimizes the polarization effects in the crystal, makes the device inherently insensitive to polarization effects associated with the surface, as well as eliminates or minimizes DC to RF dispersion observed on conventional devices grown along the c-plane. On the other hand, pseudomorphic structures grown on the c-plane along the [0001] direction have strong polarization effects which influence the charge distribution within the device. Preferably, the polarization charge at the channel/barrier interface is carefully increased to counteract backside depletion effects associated with the AlN/GaN hetero-interface transitioning from the AlN buffer structure.

Defect Density in Non-Pseudomorphic Epitaxial Layers

For some device structures, it is desirable to have a relatively thick, GaN epitaxial layer on the AlN substrate (where the lattice parameter of the GaN is approximately 2.4% larger than that of the AlN). Other applications may require a relatively thick, epitaxial layer consisting of a binary or tertiary alloy combination selected from the group consisting of AlN, GaN, and InN. These thick epitaxial structures are desired because of the high thermal conductivity of the AlN substrate and the very small total thermal expansion mismatch between AlN, GaN and alloys of these two materials. For example, a thick GaN epitaxial layer on AlN with a low threading dislocation density is desired for fabrication of 405 nm laser diodes for the Blu-ray DVD. It is also desired for fabrication of efficient blue and white light emitting diodes (LEDs).

Once thicker layers exceed the pseudomorphic limit (which is determined by the size of the lattice mismatch), they will require the formation of misfit dislocations to relieve strain in the epitaxial layer. However, by using appropriately graded structures, from pure AlN to the desired alloy structure (or to GaN), the density of threading dislocations in the final epitaxial layer can be reduced. These graded structures can be graded continuously, in a series of steps, or as a superlattice where the effective lattice parameter of the grading layer is alternatively increased and then decreased in order to impede the propagation of threading dislocations into the epitaxial layer. Similar approaches have been used to reduce the density of misfit dislocations in other lattice-mismatched semiconductor heterostructures such as GaAs on Si (lattice mismatch of 4.2%) and Ge on Si (lattice mismatch of 4%) to levels below $10^6$ cm$^{-2}$. However, it is crucial that the initial crystal substrate (Si in the above-referenced example) have much lower dislocation density. Accordingly, high-quality AlN substrates described herein with initial dislocation densities below 10,000 cm$^{-2}$ facilitate growth of thick GaN epitaxial layers thereon where the average threading dislocation density within the GaN is less than about $10^6$ cm$^{-2}$. Other thick semiconductor structures (which exceed the pseudomorphic limit) of binary and ternary alloys of AlN, GaN and InN can also be grown on the low dislocation density AlN substrates with similar results when the appropriate graded layer structure is used.

Although the foregoing description relates to AlN crystals and their growth, the skilled artisan will recognize that various aspects of the foregoing description may be used to fabricate other crystalline substrates, such as ZnO, LiGaO$_2$, MgAl$_2$O$_4$ or Si, without departing from the spirit and scope of the present invention. For example, the present method may be used to produce single crystals of ZnO. In this embodiment, Zn and O$_2$ vapor are introduced into a crystal growth enclosure, as previously described with respect to Al and N. The O$_2$ partial pressure in the crystal growth enclosure is held at greater than stoichiometric pressure relative to the Zn partial pressure. In addition, one or more nucleation sites are contained in the crystal growth enclosure, and the nucleation site(s) are cooled relative to other locations in the crystal growth enclosure. The Zn and O$_2$ vapor is deposited under conditions capable of growing single crystalline ZnO originating at the nucleation site, as described herein with respect to AlN. Optionally, the cooling step may be facilitated by placing the crystal growth enclosure within a temperature gradient, and the crystal growth enclosure may then be moved through the temperature gradient while depositing the vapor, as discussed above.

Skilled artisans will also readily recognize that while various embodiments of the present invention have been described herein as utilizing a seed crystal to promote crystal growth, the teachings herein may also be used for unseeded crystal growth, without departing from the scope and spirit of the present invention.

The modifications to the various aspects of the present invention described hereinabove are merely exemplary. It is understood that other modifications to the illustrative embodiments will readily occur to persons with ordinary skill in the art. All such modifications and variations are deemed to be within the scope and spirit of the present invention as defined by the accompanying claims. All of the patents, patent applications, journal articles, and other references mentioned above are incorporated herein by reference.

What is claimed is:

1. A method of producing single-crystal AlN, the method comprising:
   providing Al and N$_2$ vapor in a crystal growth enclosure;
   providing a nucleation site in the crystal growth enclosure;
   heating the crystal growth enclosure to form (i) an axial thermal gradient along a growth direction, and (ii) a lateral thermal gradient (a) along a direction substantially perpendicular to the growth direction and (b) in which a temperature at the nucleation site is lower than that in a region laterally displaced therefrom; and
   causing relative motion between the crystal growth enclosure and the axial thermal gradient, whereby the Al and N$_2$ vapor are deposited under conditions capable of growing single-crystalline AlN originating at the nucleation site, thereby forming an AlN single crystal extending along the growth direction,
   wherein the axial thermal gradient and the lateral thermal gradient are formed at least in part by a plurality of baffles disposed at least at one of (i) a proximal end of the crystal growth enclosure or (ii) a distal end of the crystal growth enclosure opposite the proximal end, the growth direction extending from the distal end toward the proximal end.

2. The method of claim 1, further comprising maintaining an N2 partial pressure greater than stoichiometric pressure relative to the Al within the crystal growth enclosure.

3. The method of claim 1, further comprising maintaining a total vapor pressure at super-atmospheric pressure within the crystal growth enclosure.

4. The method of claim 1, wherein one or more of the baffles comprises tungsten.

5. The method of claim 1, wherein one or more of the baffles each defines a hole therethrough.

6. The method of claim 1, wherein one or more baffles are disposed at each of the distal end and the proximal end.

7. The method of claim 1, wherein one or more of the baffles is disposed outside of the crystal growth enclosure.

8. The method of claim 1, wherein the lateral thermal gradient is convex in the growth direction.

9. The method of claim 1, wherein the axial thermal gradient is greater than 100° C./cm.

10. The method of claim 1, wherein the crystal growth enclosure comprises a selective barrier configured to substantially prevent passage of Al vapor and permit passage of N2 vapor therethrough.

11. The method of claim 1, wherein providing the nucleation site in the crystal growth enclosure comprises disposing a seed crystal proximate the proximal end of the crystal growth enclosure.

12. The method of claim 11, wherein the seed crystal comprises single-crystalline AlN.

13. The method of claim 1, wherein providing the Al and $N_2$ vapor comprises subliming solid source material.

14. The method of claim 13, wherein the solid source material comprises polycrystalline AlN disposed within the crystal growth enclosure.

15. The method of claim 1, wherein providing the Al and $N_2$ vapor comprises injecting a source gas.

16. The method of claim 1, wherein a diameter of the AlN single crystal increases along the growth direction.

17. The method of claim 1, further comprising separating an AlN wafer from the AlN single crystal.

18. The method of claim 17, further comprising polishing a surface of the AlN wafer.

19. The method of claim 17, further comprising depositing an epitaxial layer on a surface of the AlN wafer.

20. The method of claim 19, wherein the epitaxial layer comprises $Al_xGa_yIn_{1-x-y}N$, wherein $0 \leq x \leq 1$ and $0 \leq y \leq 1-x$.

21. The method of claim 19, wherein the epitaxial layer is pseudomorphically strained with respect to the AlN wafer.

\* \* \* \* \*